(12) United States Patent
Liu et al.

(10) Patent No.: US 11,962,143 B2
(45) Date of Patent: Apr. 16, 2024

(54) BATTERY PROTECTION CIRCUIT, BATTERY PROTECTION BOARD, BATTERY, AND TERMINAL DEVICE

(71) Applicant: Honor Device Co., Ltd., Shenzhen (CN)

(72) Inventors: Xinyu Liu, Shenzhen (CN); Xialing Zhang, Shenzhen (CN); Yanbin An, Shenzhen (CN)

(73) Assignee: Honor Device Co., Ltd., Shenzhen (CN)

( * ) Notice: Subject to any disclaimer, the term of this patent is extended or adjusted under 35 U.S.C. 154(b) by 399 days.

(21) Appl. No.: 17/416,519

(22) PCT Filed: Nov. 29, 2019

(86) PCT No.: PCT/CN2019/121914
§ 371 (c)(1),
(2) Date: Jun. 21, 2021

(87) PCT Pub. No.: WO2020/125375
PCT Pub. Date: Jun. 25, 2020

(65) Prior Publication Data
US 2022/0085598 A1    Mar. 17, 2022

(30) Foreign Application Priority Data

Dec. 21, 2018 (CN) .......................... 201811572828.9
Apr. 25, 2019 (CN) .......................... 201910336826.8

(51) Int. Cl.
*H02J 7/00* (2006.01)
*G01R 31/3842* (2019.01)
(Continued)

(52) U.S. Cl.
CPC ............ *H02H 7/18* (2013.01); *G01R 31/3842* (2019.01); *H01M 10/425* (2013.01); *H02J 7/00304* (2020.01); *H02J 7/0042* (2013.01)

(58) Field of Classification Search
CPC . H02H 7/18; H02H 3/087; H02H 3/05; G01R 31/3842; H01M 10/425;
(Continued)

(56) References Cited

U.S. PATENT DOCUMENTS 6,121,693 A     9/2000  Rock
6,879,133 B1    4/2005  Geren
(Continued)

FOREIGN PATENT DOCUMENTS

CN          1858935 A      11/2006
CN          101232110 A     7/2008
(Continued)

*Primary Examiner* — Jack Chiang
*Assistant Examiner* — Brandon Bowers
(74) *Attorney, Agent, or Firm* — RIMON PC

(57) ABSTRACT

This application provides a battery protection circuit, a battery protection board, a battery, and a terminal device. The battery protection circuit includes: a first detection unit; a second detection unit; and a current detection element, a first switch unit, and a second switch unit that are configured to connect to an electrochemical cell in series, to form a charging loop or a discharging loop. The first detection unit corresponds to the first switch unit, and the second detection unit corresponds to the second switch unit. Each detection unit controls, based on a detected voltage at two ends of the same current detection element, a corresponding switch unit to be closed or opened, so as to control the loop to be closed or opened. The first detection unit and the second detection unit detect the voltage at the two ends of the same current detection element to detect a current passing through the electrochemical cell, so that a quantity of current detection (Continued)

elements in the battery protection circuit can be effectively reduced, to reduce impedance of the battery protection circuit.

16 Claims, 13 Drawing Sheets

(51) Int. Cl.
  *H01M 10/42* (2006.01)
  *H02H 7/18* (2006.01)

(58) Field of Classification Search
  CPC .... H02J 7/00304; H02J 7/0042; H02J 7/0047; Y02E 60/10
  See application file for complete search history.

(56) References Cited

U.S. PATENT DOCUMENTS

| | | | |
|---|---|---|---|
| 11,043,826 B2 | 6/2021 | Maetani et al. | |
| 2005/0180180 A1* | 8/2005 | Uematsu | H02M 3/33569 363/21.12 |
| 2012/0069481 A1 | 3/2012 | Yamada | |
| 2015/0054471 A1 | 2/2015 | Hausman, Jr. et al. | |
| 2016/0294178 A1 | 10/2016 | Ohki | |
| 2018/0041056 A1 | 2/2018 | Maetani | |
| 2022/0158462 A1* | 5/2022 | Lei | H02J 7/0045 |

FOREIGN PATENT DOCUMENTS

| | | | | |
|---|---|---|---|---|
| CN | 101483335 | A | 7/2009 | |
| CN | 101534017 | A | 9/2009 | |
| CN | 201369556 | Y | 12/2009 | |
| CN | 101741121 | A | 6/2010 | |
| CN | 201549882 | U | 8/2010 | |
| CN | 101888104 | A | 11/2010 | |
| CN | 102455381 | A | 5/2012 | |
| CN | 203522159 | U | 4/2014 | |
| CN | 104218542 | A | 12/2014 | |
| CN | 205355895 | U | 6/2016 | |
| CN | 205407232 | U | 7/2016 | |
| CN | 107689650 | A | 2/2018 | |
| CN | 107785968 | A | 3/2018 | |
| CN | 207234432 | U | 4/2018 | |
| CN | 207318660 | U | 5/2018 | |
| CN | 207481668 | U | 6/2018 | |
| CN | 109193569 | A | 1/2019 | |
| EP | 2079142 | A | 7/2009 | |
| JP | 61043858 | A | 3/1986 | |
| JP | 2010115070 | A | 5/2010 | |
| KR | 20180016299 | A | 2/2018 | |
| WO | WO-2020125375 | A1 * | 6/2020 | G01R 31/3842 |

* cited by examiner

BATTERY PROTECTION CIRCUIT, BATTERY PROTECTION BOARD, BATTERY, AND TERMINAL DEVICE

This application is a national stage of International Application No. PCT/CN2019/121914, filed on Nov. 29, 2019, and claims priority to Chinese Patent Application No. 201811572828.9, filed with the China National Intellectual Property Administration on Dec. 21, 2018 and claims priority to Chinese Patent Application No. 201910336826.8, filed with the China National Intellectual Property Administration on Apr. 25, 2019, which are hereby incorporated by reference in its entirety.

TECHNICAL FIELD

This application relates to the circuit field, and more specifically, to a battery protection circuit, a battery protection board, a battery, and a terminal device.

BACKGROUND

With enhancement of battery energy density and increasingly wide application of the battery, ensuring lithium battery safety is increasingly important. Therefore, a battery protection board is usually disposed in a lithium battery, and the battery protection board can protect the battery against overvoltage, undervoltage, charging overcurrent, and discharging overcurrent.

A current battery protection board can implement double protection for a battery. After the first protection fails, the second protection can further ensure battery safety. In charging overcurrent and discharging overcurrent protection, the first protection and the second protection correspond to respective detection chips, switch elements, and current detection elements. In the first protection, the first protection is implemented based on a voltage that is at two ends of a first current detection element and that is detected by a first detection chip. In the second protection, the second protection is implemented based on a voltage that is at two ends of a second current detection element and that is detected by a second detection chip.

However, the foregoing battery protection board has a comparatively large loss, and as a result, the battery has a comparatively large loss and generates a comparatively large amount of heat. Considering that a current terminal device such as a smartphone has an increasingly large loss and an increasingly high charging speed, how to reduce a battery loss to reduce costs is a problem that needs to be urgently resolved at present.

SUMMARY

This application provides a battery protection circuit, a battery protection board, and a battery, to effectively reduce a battery loss.

According to a first aspect, a battery protection circuit is provided, where the battery protection circuit includes:

a first output terminal and a second output terminal, configured to electrically connect to a power supply or a load;

a current detection element, a first switch unit, and a second switch unit, configured to connect to an electrochemical cell in series between the first output terminal and the second output terminal, so that the current detection element, the first switch unit, the second switch unit, the electrochemical cell, and the load or the power supply form a loop, to charge or discharge the electrochemical cell, where the current detection element includes two terminals;

a first detection unit, including a power supply terminal, a control terminal, and two detection terminals, where the power supply terminal of the first detection unit is electrically connected to the first output terminal, the two detection terminals of the first detection unit are electrically connected to the two terminals of the current detection element respectively, and the control terminal of the first detection unit is electrically connected to a terminal of the first switch unit; and a second detection unit, including a power supply terminal, a control terminal, and two detection terminals, where the power supply terminal of the second detection unit is electrically connected to the first output terminal, the two detection terminals of the second detection unit are electrically connected to the two terminals of the current detection element respectively, and the control terminal of the second detection unit is electrically connected to a terminal of the second switch unit.

Therefore, the battery protection circuit provided in this embodiment of this application includes: the first detection unit; the second detection unit; and the current detection element, the first switch unit, and the second switch unit that are configured to connect to the electrochemical cell in series, so that the current detection element, the first switch unit, the second switch unit, the electrochemical cell, and the load or the power supply form the loop. The first detection unit corresponds to the first switch unit, and the second detection unit corresponds to the second switch unit. Each detection unit controls, based on a detected voltage at two ends of the same current detection element, a corresponding switch unit to be closed or opened, so as to control the loop to be closed or opened. The first detection unit and the second detection unit detect the voltage at the two ends of the same current detection element to detect a current passing through the electrochemical cell, so that a quantity of current detection elements in the battery protection circuit can be effectively reduced, to reduce impedance of the battery protection circuit. In this way, a loss of a battery protection board is reduced, thereby reducing costs. Especially as a current intelligent terminal has an increasingly large loss and an increasingly high charging speed, reducing a loss of a battery protection board is particularly important.

Optionally, the battery protection circuit further includes:

a first fault isolation unit, electrically connected to the first detection unit and the current detection element separately, so that the two ends of the current detection element are not short-circuited when a circuit electrically connected to a first terminal of the first fault isolation unit is short-circuited, where the first terminal of the first fault isolation unit is electrically connected to one detection terminal of the first detection unit.

Therefore, in the battery protection circuit provided in this embodiment of this application, the first fault isolation unit electrically connected to the first detection unit and the current detection element is disposed. In some cases, for example, when a short circuit occurs between the two detection terminals in the first detection unit that are configured to detect the voltage at the two ends of the current detection element, or when a short circuit occurs between two terminals of a first filter capacitor connected in parallel between the two detection terminals of the first detection unit that are configured to detect the voltage of the current detection element, because the first fault isolation unit is disposed, a current can still flow through the current detection element, to form a voltage at the two ends of the current detection element. The loop can be controlled to be closed or opened, by detecting the voltage at the two ends of the current detection element. This does not affect overcurrent protection of the second detection unit and the second switch unit, and does not cause burnout of the first detection unit or the first filter capacitor.

Optionally, the first fault isolation unit includes a first fault isolation element. The first fault isolation element includes a first terminal and a second terminal. The first terminal of the first fault isolation element is the first terminal of the first fault isolation unit. The two detection terminals of the first detection unit include a first detection terminal and a second detection terminal. The two terminals of the current detection element include a first terminal and a second terminal.

The first terminal of the first fault isolation element is electrically connected to the first detection terminal of the first detection unit. The second terminal of the first fault isolation element is electrically connected to the first terminal of the current detection element. The second terminal of the current detection element is electrically connected to the second detection terminal of the first detection unit. Optionally, the first fault isolation element is a resistor.

Optionally, the first fault isolation unit includes a first fault isolation element and a second fault isolation element. The first fault isolation element includes a first terminal and a second terminal. The second fault isolation element includes a first terminal and a second terminal. The first terminal of the first fault isolation element or the first terminal of the second fault isolation element is the first terminal of the first fault isolation unit. The two detection terminals of the first detection unit include a first detection terminal and a second detection terminal. The two terminals of the current detection element include a first terminal and a second terminal.

The first terminal of the first fault isolation element is electrically connected to the first detection terminal of the first detection unit. The second terminal of the first fault isolation element is electrically connected to the first terminal of the current detection element. The first terminal of the second fault isolation element is electrically connected to the second detection terminal of the first detection unit. The second terminal of the second fault isolation element is electrically connected to the second terminal of the current detection element.

Optionally, the first fault isolation element and/or the second fault isolation element are resistors/is a resistor.

Optionally, an absolute value of a difference between a resistance value of the current detection element and impedance of a circuit formed through a parallel connection between the first fault isolation unit and the current detection element is less than or equal to a preset value.

Therefore, in the battery protection circuit provided in this embodiment of this application, because the absolute value of the difference between the resistance value of the current detection element and the equivalent impedance of the circuit formed through the parallel connection between the first fault isolation unit and the current detection element is less than or equal to the preset value, before and after some faults occur, for example, before and after a short circuit occurs between the terminals in the first detection unit that are configured to detect the voltage at the two ends of the current detection element, or before and after a short circuit occurs between the two terminals of the first filter capacitor connected in parallel between the terminals of the first detection unit that are configured to detect the voltage of the current detection element, a difference between thresholds, for charging overcurrent, of a current passing through the electrochemical cell can be comparatively small, or a difference between thresholds, for discharging overcurrent, of a current passing through the electrochemical cell can be comparatively small. This can improve overcurrent protection reliability.

Optionally, the battery protection circuit further includes:
a second fault isolation unit, electrically connected to the second detection unit and the current detection element separately, so that the two ends of the current detection element are not short-circuited when a circuit electrically connected to a first terminal of the second fault isolation unit is short-circuited, where the first terminal of the second fault isolation unit is electrically connected to one detection terminal of the second detection unit.

Therefore, in the battery protection circuit provided in this embodiment of this application, the second fault isolation unit electrically connected to the second detection unit and the current detection element is disposed. In some cases, for example, when a short circuit occurs between the two detection terminals in the second detection unit that are configured to detect the voltage at the two ends of the current detection element, or when a short circuit occurs between two terminals of a second filter capacitor connected in parallel between the two detection terminals, because the second fault isolation unit is disposed, currents can respectively pass through the second fault isolation unit and the current detection element, and a parallel connection relationship is formed between the second fault isolation unit and the current detection element, so that a voltage exists at the two ends of the current detection element. The loop can be controlled to be closed or opened, by detecting the voltage at the two ends of the current detection element. This does not affect overcurrent protection of the first detection unit and the first switch unit, and does not cause burnout of the second detection unit or the second filter capacitor.

Optionally, the second fault isolation unit includes a third fault isolation element, and the third fault isolation element includes a first terminal and a second terminal. The first terminal of the third fault isolation element is the first terminal of the second fault isolation unit. The two detection terminals of the second detection unit include a first detection terminal and a second detection terminal. The two terminals of the current detection element include the first terminal and the second terminal.

The first terminal of the third fault isolation element is electrically connected to the first detection terminal of the second detection unit. The second terminal of the third fault isolation element is electrically connected to the first terminal of the current detection element. The second terminal of the current detection element is electrically connected to the second detection terminal of the second detection unit.

Optionally, the third fault isolation element is a resistor.

Optionally, the second fault isolation unit includes a third fault isolation element and a fourth fault isolation element. The third fault isolation element includes a first terminal and a second terminal. The fourth fault isolation element includes a first terminal and a second terminal. The first terminal of the third fault isolation element or the first terminal of the fourth fault isolation element is the first terminal of the second fault isolation unit. The two detection terminals of the second detection unit include a first detection terminal and a second detection terminal. The two terminals of the current detection element include the first terminal and the second terminal.

The first terminal of the third fault isolation element is electrically connected to the first detection terminal of the second detection unit. The second terminal of the third fault isolation element is electrically connected to the first terminal of the current detection element. The first terminal of the fourth fault isolation element is electrically connected to the second detection terminal of the second detection unit. The second terminal of the fourth fault isolation element is electrically connected to the second terminal of the current detection element.

Optionally, the third fault isolation element and/or fourth fault isolation element are resistors/is a resistor.

Optionally, an absolute value of a difference between the resistance value of the current detection element and equivalent impedance of a circuit formed through a parallel connection between the second fault isolation unit and the current detection element is less than or equal to a preset value.

Optionally, the battery protection circuit further includes: the first filter capacitor, connected in parallel between the two detection terminals of the first detection unit.

Therefore, one filter capacitor is connected in parallel between the two detection terminals of the first detection unit, so that interference clutter, of detected signals at the two ends of the current detection element, between the two detection terminals of the first detection unit can be effectively reduced, to improve circuit reliability.

Optionally, the battery protection circuit further includes: the second filter capacitor, connected in parallel between the two detection terminals of the second detection unit.

Therefore, one filter capacitor is connected in parallel between the two detection terminals of the second detection unit, so that interference clutter, of detected signals at the two ends of the current detection element, between the two detection terminals of the second detection unit can be effectively reduced, to improve circuit reliability.

Optionally, the control terminal of the first detection unit includes a discharging control terminal and a charging control terminal, the first switch unit includes a first discharging switch element and a first charging switch element, the first discharging switch element includes a first terminal, the first terminal of the first discharging switch element is electrically connected to the discharging control terminal of the first detection unit, the first charging switch element includes a first terminal, and the first terminal of the first charging switch element is electrically connected to the charging control terminal of the first detection unit; and the control terminal of the second detection unit includes a discharging control terminal and a charging control terminal, the second switch unit includes a second discharging switch element and a second charging switch element, the second discharging switch element includes a first terminal, the first terminal of the second discharging switch element is electrically connected to the discharging control terminal of the second detection unit, the second charging switch element includes a first terminal, and the first terminal of the second charging switch element is electrically connected to the charging control terminal of the second detection unit.

According to a second aspect, a battery protection circuit is provided, where the battery protection circuit includes:

two output terminals, configured to electrically connect to a power supply or a load;

a current detection element, a first switch unit, and a second switch unit, configured to connect to an electrochemical cell in series between the two output terminals, so that the current detection element, the first switch unit, the second switch unit, the electrochemical cell, and the load or the power supply form a loop, to charge or discharge the electrochemical cell, where the first switch unit and the second switch unit are both configured to control the loop to be closed or opened;

a first detection unit, configured to detect a voltage at two ends of the battery detection element, and if the voltage at the two ends of the battery detection element is greater than a preset overcurrent detection voltage threshold of the first detection unit, output a control signal to the first switch unit to open the first switch unit; and a second detection unit, configured to detect the voltage at the two ends of the battery detection element, and if the voltage at the two ends of the battery detection element is greater than a preset overcurrent detection voltage threshold of the second detection unit, output a control signal to the second switch unit to open the second switch unit.

The preset overcurrent detection voltage threshold of the first detection unit is different from the preset overcurrent detection voltage threshold of the second detection unit.

Therefore, the battery protection circuit provided in this embodiment of this application includes: the first detection unit; the second detection unit; and the current detection element, the first switch unit, and the second switch unit that are configured to connect to the electrochemical cell in series, so that the current detection element, the first switch unit, the second switch unit, the electrochemical cell, and the load or the power supply form the loop. The first detection unit corresponds to the first switch unit, and the second detection unit corresponds to the second switch unit. Each detection unit controls, based on the detected voltage at the two ends of the same current detection element, a corresponding switch unit to be closed or opened, so as to control the loop to be closed or opened. The first detection unit and the second detection unit detect the voltage at the two ends of the same current detection element to detect a current passing through the electrochemical cell, so that a quantity of current detection elements in the battery protection circuit can be effectively reduced, to reduce impedance of the battery protection circuit. In this way, a loss of a battery protection board is reduced, thereby reducing costs. Especially as a current intelligent terminal has an increasingly large loss and an increasingly high charging speed, reducing a loss of a battery protection board is particularly important.

Optionally, the battery protection circuit further includes: a first fault isolation unit, electrically connected to the first detection unit and the current detection element separately, and configured to shunt, with the current detection element when a circuit electrically connected to a first terminal of the first fault isolation unit is short-circuited, the current passing through the electrochemical cell, so that the two ends of the current detection element are not short-circuited, where the first terminal of the first fault isolation unit is electrically connected to one detection terminal of the first detection unit.

Therefore, in the battery protection circuit provided in this embodiment of this application, the first fault isolation unit electrically connected to the first detection unit and the current detection element is disposed. In some cases, for example, when a short circuit occurs between the two detection terminals in the first detection unit that are configured to detect the voltage at the two ends of the current detection element, or when a short circuit occurs between two terminals of a first filter capacitor connected in parallel between the two detection terminals of the first detection unit that are configured to detect the voltage of the current detection element, because the first fault isolation unit is disposed, currents can respectively pass through the first fault isolation unit and the current detection element, to form a voltage at the two ends of the current detection element. The loop can be controlled to be closed or opened, by detecting the voltage at the two ends of the current detection element. This does not affect overcurrent protection of the second detection unit and the second switch unit, and does not cause burnout of the first detection unit or the first filter capacitor.

Optionally, the first fault isolation unit includes a first fault isolation element. The first fault isolation element includes a first terminal and a second terminal. The first terminal of the first fault isolation element is the first terminal of the first fault isolation unit. The first detection unit includes a first detection terminal and a second detection terminal. The current detection element includes a first terminal and a second terminal.

The first terminal of the first fault isolation element is electrically connected to the first detection terminal of the first detection unit. The second terminal of the first fault isolation element is electrically connected to the first terminal of the current detection element. The second terminal of the current detection element is electrically connected to the second detection terminal of the first detection unit.

Optionally, the first fault isolation element is a resistor.

Optionally, the first fault isolation unit includes a first fault isolation element and a second fault isolation element. The first fault isolation element includes a first terminal and a second terminal. The second fault isolation element includes a first terminal and a second terminal. The first terminal of the first fault isolation element or the first terminal of the second fault isolation element is the first terminal of the first fault isolation unit. The first detection unit includes a first detection terminal and a second detection terminal. The current detection element includes a first terminal and a second terminal.

The first terminal of the first fault isolation element is electrically connected to the first detection terminal of the first detection unit. The second terminal of the first fault isolation element is electrically connected to the first terminal of the current detection element. The first terminal of the second fault isolation element is electrically connected to the second detection terminal of the first detection unit. The second terminal of the second fault isolation element is electrically connected to the second terminal of the current detection element.

Optionally, an absolute value of a difference between a resistance value of the current detection element and equivalent impedance of a circuit formed through a parallel connection between the first fault isolation unit and the current detection element is less than or equal to a preset value.

Optionally, the battery protection circuit further includes:

a second fault isolation unit, electrically connected to the second detection unit and the current detection element separately, and configured to shunt, with the current detection element when a circuit electrically connected to a first terminal of the second fault isolation unit is short-circuited, the current passing through the electrochemical cell, so that the two ends of the current detection element are not short-circuited, where the first terminal of the second fault isolation unit is electrically connected to one detection terminal of the second detection unit.

Therefore, in the battery protection circuit provided in this embodiment of this application, the second fault isolation unit electrically connected to the second detection unit and the current detection element is disposed. In some cases, for example, when a short circuit occurs between the two detection terminals in the second detection unit that are configured to detect the voltage at the two ends of the current detection element, or when a short circuit occurs between two terminals of a second filter capacitor connected in parallel between the two detection terminals, because the second fault isolation unit is disposed, currents can respectively pass through the second fault isolation unit and the current detection element, and a parallel connection relationship is formed between the second fault isolation unit and the current detection element, so that a voltage exists at the two ends of the current detection element. The loop can be controlled to be closed or opened, by detecting the voltage at the two ends of the current detection element. This does not affect overcurrent protection of the first detection unit and the first switch unit, and does not cause burnout of the second detection unit or the second filter capacitor.

Optionally, the second fault isolation unit includes:

a third fault isolation element, where the third fault isolation element includes a first terminal and a second terminal, the first terminal of the third fault isolation element is the first terminal of the second fault isolation unit, the second detection unit includes a first detection terminal and a second detection terminal, and the current detection element includes the first terminal and the second terminal.

The first terminal of the third fault isolation element is electrically connected to the first detection terminal of the second detection unit. The second terminal of the third fault isolation element is electrically connected to the first terminal of the current detection element. The second terminal of the current detection element is electrically connected to the second detection terminal of the second detection unit.

Optionally, the second fault isolation unit includes:

a third fault isolation element and a fourth fault isolation element, where the third fault isolation element includes a first terminal and a second terminal, the fourth fault isolation element includes a first terminal and a second terminal, the first terminal of the third fault isolation element or the first terminal of the fourth fault isolation element is the first terminal of the second fault isolation unit, the second detection unit includes a first detection terminal and a second detection terminal, and the current detection element includes the first terminal and the second terminal.

The first terminal of the third fault isolation element is electrically connected to the first detection terminal of the second detection unit. The second terminal of the third fault isolation element is electrically connected to the first terminal of the current detection element. The first terminal of the fourth fault isolation element is electrically connected to the second detection terminal of the second detection unit. The second terminal of the fourth fault isolation element is electrically connected to the second terminal of the current detection element.

According to a third aspect, a battery protection board is provided. The battery protection board includes the battery protection circuit in any one of the possible implementations of the first aspect or the second aspect.

According to a fourth aspect, a battery is provided. The battery includes an electrochemical cell and the battery protection board in any one of the possible implementations of the third aspect. A battery protection circuit in the battery protection board includes two input terminals, and each of the two input terminals is electrically connected to the electrochemical cell.

According to a fifth aspect, a terminal device is provided. The terminal device includes a connector, a power supply, a load, and the battery in the fourth aspect. The connector is electrically connected to the power supply, the power supply is electrically connected to the battery, and the battery is electrically connected to the load.

According to a sixth aspect, a terminal device is provided, where the terminal device includes a connector, a power supply, a load, and a battery, the connector is electrically connected to the power supply, the battery includes a battery protection circuit board and an electrochemical cell, and the battery protection board includes:

two output terminals, electrically connected to the load or the power supply;

a current detection element, a first switch unit, and a second switch unit, connected to the electrochemical cell in series between the two output terminals, so that the current detection element, the first switch unit, the second switch unit, the electrochemical cell, and the load or the power supply form a loop, to charge or discharge the electrochemical cell, where the first switch unit and the second switch unit are both configured to control the loop to be closed or opened;

a first detection unit, configured to detect a voltage at two ends of the battery detection element, and if the voltage at the two ends of the current detection element is greater than a preset overcurrent detection voltage threshold of the first detection unit, output a control signal to the first switch unit to open the first switch unit; and a second detection unit, configured to detect the voltage at the two ends of the battery detection element, and if the voltage at the two ends of the current detection element is greater than a preset overcurrent detection voltage threshold of the second detection unit, output a control signal to the second switch unit to open the second switch unit.

The preset overcurrent detection voltage threshold of the first detection unit is different from the preset overcurrent detection voltage threshold of the second detection unit.

Optionally, the first detection unit includes two detection terminals configured to detect the voltage at the two ends of the current detection unit, and the battery protection board further includes:

a first fault isolation unit, electrically connected to the first detection unit and the current detection element separately, and configured to shunt, with the current detection element when a circuit electrically connected to a first terminal of the first fault isolation unit is short-circuited, a current passing through the electrochemical cell, so that the two ends of the current detection element are not short-circuited, where the first terminal of the first fault isolation unit is electrically connected to one detection terminal of the first detection unit.

Optionally, the second detection unit includes two detection terminals configured to detect the voltage at the two ends of the battery detection unit, and the battery protection board further includes:

a second fault isolation unit, electrically connected to the second detection unit and the current detection element separately, and configured to shunt, with the current detection element when a circuit electrically connected to a first terminal of the second fault isolation unit is short-circuited, a current passing through the electrochemical cell, so that the two ends of the current detection element are not short-circuited, where the first terminal of the second fault isolation unit is electrically connected to one detection terminal of the second detection unit.

DESCRIPTION OF EMBODIMENTS

The following describes technical solutions of this application with reference to accompanying drawings.

Figure 1:
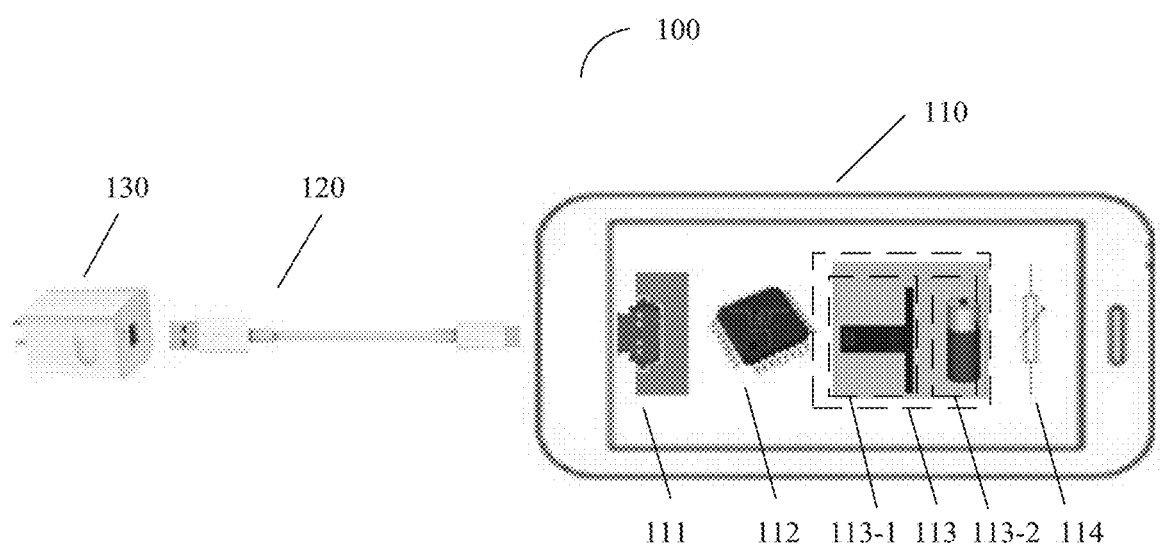
FIG. 1 is a schematic diagram of an application scenario to which embodiments of this application are applicable.

FIG. 1 shows an application scenario to which embodiments of this application are applicable. In the scenario shown in FIG. 1, a terminal device 110, a cable 120, and a charger 130 are included. The charger 130 is electrically connected to the terminal device 110 by using the cable 120. The terminal device 110 includes a connector 111, a charging management chip 112, a battery 113, and a load 114. The connector 111 is electrically connected to the charging management chip 112. The battery 113 is electrically connected to the charging management chip 112 and the load 114 separately. The battery includes a battery protection board 113-1 and an electrochemical cell 113-2. The load 114 may be a power-consuming device in the terminal device. For example, the load 114 may be various power-consuming devices, such as a microphone, a camera, or a motor. The charging management chip may be understood as a power supply that charges the battery. During charging, a current flow direction is as follows: the charger 130→the cable 120→the connector 111→the charging management chip 112→the battery protection board 113-1→the electrochemical cell 113-2. During discharging, a current flow direction is as follows: the electrochemical cell 113-2→the battery protection board 113-1→the load 114.

For ease of understanding, related terms in the embodiments of this application are first described.

Charging Overcurrent and Discharging Overcurrent:

A battery protection board has a definite requirement on a value of a current. Regardless of a charging process or a discharging process, when a preset current threshold is exceeded, in a normal case, the battery protection board cuts off a charging loop or a discharging loop to avoid an overheating effect caused by a continuous current flow through an electrochemical cell. The overheating effect leads to problems in terms of a battery lifespan, a battery capacity, and battery safety. The charging loop may also be understood as a loop in which a current passes through the electrochemical cell during charging. The discharging loop may be understood as a loop in which a current passes through the electrochemical cell during discharging.

In the embodiments of this application, a phenomenon in which a current (referred to as a charging current for ease of differentiation) passing through an electrochemical cell during charging exceeds a preset current threshold may be referred to as charging overcurrent, and a phenomenon in which a current (referred to as a discharging current for ease of differentiation) passing through the electrochemical cell during discharging exceeds the preset current threshold may be referred to as discharging overcurrent. Correspondingly, a protective measure taken for charging overcurrent may be referred to as charging overcurrent protection, and a protective measure taken for discharging overcurrent may be referred to as discharging overcurrent protection. Charging overcurrent protection and discharging overcurrent protection may be collectively referred to as overcurrent protection.

Double Protection:

A battery protection board may implement overvoltage protection, undervoltage protection, and overcurrent protection for a battery (for example, a lithium battery). Each type of protection may implement double protection for the battery. Generally, a voltage threshold or current threshold of the first protection is less than a voltage threshold or current threshold of the second protection. In overcurrent protection, a principle of charging overcurrent protection is the same as that of discharging overcurrent protection. The following uses charging overcurrent protection as an example to briefly describe an overcurrent protection principle.

A first-detection unit and a second-detection unit may be disposed on the battery protection board. During charging, if a current flowing through an electrochemical cell is greater than a current threshold (referred to as a first current threshold for ease of differentiation) preset by the first-detection unit, a charging loop may be cut off by using the first-detection unit, to shut off the current passing through the electrochemical cell. If the first-detection unit fails, and cannot cut off the charging loop in a timely manner, the electrochemical cell continues to be charged. If the current flowing through the electrochemical cell is greater than a current threshold preset by the second-detection unit, the charging loop may be cut off by using the second-detection unit, to shut off the current passing through the electrochemical cell.

In a possible implementation, two detection resistors (referred to as a first detection resistor and a second detection resistor for ease of differentiation) may be connected in series in the charging loop or a discharging loop. The first-detection unit is configured to detect a voltage at two ends of the first detection resistor, and the second-detection unit is configured to detect a voltage at two ends of the second detection resistor. A current passing through the electrochemical cell may be detected by detecting the voltage at the two ends of each of the two detection resistors. A reason is as follows: $I=U/R$, where $I$ is a current passing through the charging loop, $U$ is the voltage at the two ends of the detection resistor (the first detection resistor or the second detection resistor), and $R$ is a resistance value of the detection resistor. The voltage and the resistance value of the detection resistor are known, and a current passing through the detection resistor can be obtained by using the formula $I=U/R$. The detection resistor and the electrochemical cell are connected in series in the charging loop or the discharging loop. Therefore, the obtained current of the detection resistor is also the current passing through the electrochemical cell. In this way, the current passing through the electrochemical cell can be detected by using the voltage detected by the detection unit, to implement overcurrent protection. If the voltage at the two ends of the first detection resistor is greater than a preset overcurrent detection voltage threshold of the first-detection unit, the charging loop or the discharging loop is cut off by using the first-detection unit, to shut off the current passing through the electrochemical cell. If the voltage at the two ends of the second detection resistor is greater than a preset overcurrent detection voltage threshold of the second-detection unit, the charging loop or the discharging loop may be cut off by using the second-detection unit, to shut off the current passing through the electrochemical cell.

It should be understood that the preset overcurrent detection voltage threshold of the detection unit (for example, the first-detection unit or the second-detection unit) is a fixed value, and a detection resistor may be selected based on requirements of the preset overcurrent detection voltage threshold and the overcurrent protection current threshold of the detection unit. $R=U'/I'$, where $U'$ is the preset overcurrent detection voltage threshold preset by the detection unit, and $I'$ is the current threshold. A resistance value of the detection resistor can be obtained by using the formula $R=U'/I'$.

In this way, disposing two detection units on the battery protection board can effectively ensure safety of the battery.

In the foregoing double protection for the battery, the battery protection board has a comparatively large loss. To reduce a loss of a battery protection board, the embodiments of this application provide a battery protection circuit disposed on the battery protection board, to help reduce the loss of the battery protection board, thereby reducing costs of the battery protection board.

In the embodiments of this application, one current detection element is disposed for a first-detection unit and a second-detection unit, so that the first-detection unit and the second detection unit jointly use the one current detection element to implement overcurrent protection. An objective of reducing a loss of a battery protection board is achieved by reducing a quantity of current detection elements, so as to reduce costs of the battery protection board.

The following describes in detail the battery protection circuit in the embodiments of this application with reference to FIG. 2 to FIG. 13. It should be understood that connection relationships of battery protection circuits shown in FIG. 2 to FIG. 13 are merely examples for description. Any battery protection circuit that can implement functional modules (for example, a first detection unit, a second detection unit, a first fault isolation unit, and a second fault isolation unit) falls within the protection scope of the embodiments of this application, and the examples shall not be construed as a limitation on the embodiments of this application.

It should be noted that an electrical connection between A and B in the embodiments of this application may be understood as follows: A and B are electrically connected to each other directly; or may be understood as follows: A and B are electrically connected to each other by using another element. A specific form is not limited.

Figure 2:
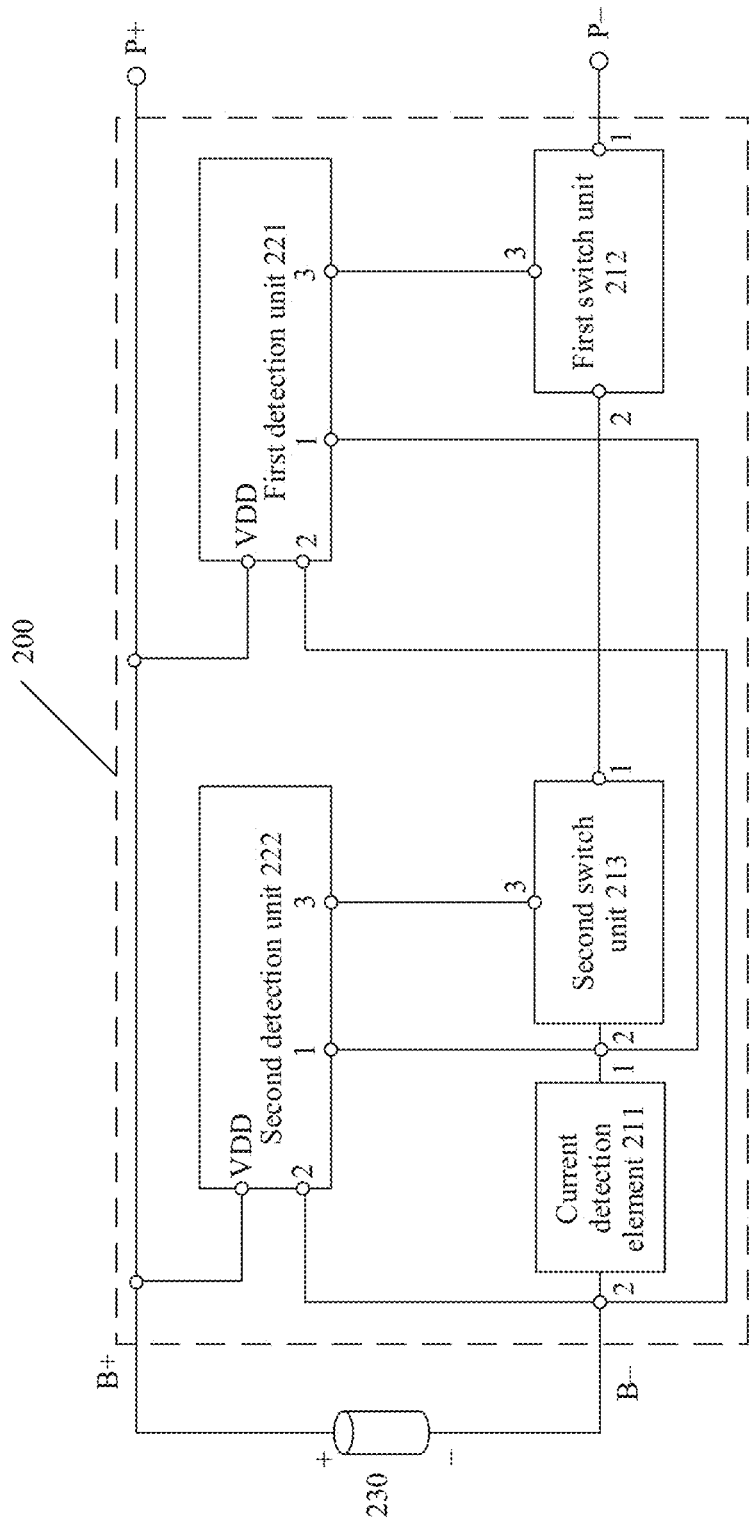
FIG. 2 is a schematic structural diagram of a battery protection circuit according to an embodiment of this application.

Referring to FIG. 2, FIG. 2 includes a battery protection circuit 200 and an electrochemical cell 230. The battery protection circuit 200 includes a first output terminal P+, a second output terminal P−, a current detection element 211, a first switch unit 212, a second switch unit 213, a first detection unit 221, and a second detection unit 222.

The first output terminal P+ and the second output terminal P− are configured to electrically connect to a power supply or a load. The power supply may be the charging management chip 112 shown in FIG. 1, and the load may be the load 114 shown in FIG. 1.

The current detection element 211, the first switch unit 212, and the second switch unit 213 are configured to connect to the electrochemical cell 230 in series between the first output terminal P+ and the second output terminal P−, so that the current detection element 211, the first switch unit 212, the second switch unit 213, the electrochemical cell 230, and the load or the power supply form a loop, to charge or discharge the electrochemical cell 230. The first switch unit 212 and the second switch unit 213 are both configured to control the loop to be closed or opened. The battery protection circuit 200 further includes two input terminals: an input terminal B+ and an input terminal B−, which are electrically connected to two ends of the electrochemical cell 230 respectively, to form the loop including the current detection element 211, the first switch unit 212, the second switch unit 213, the electrochemical cell 230, and the load or the power supply. The loop may be a charging loop or a discharging loop. In the charging loop, a current direction is as follows: the output terminal P+→the electrochemical cell 230→the current detection element 211→the second switch unit 213→the first switch unit 212→the output terminal P−. In the discharging loop, a current direction is as follows: a positive electrode of the electrochemical cell 230→the output terminal P+→the output terminal P−→the first switch unit 212→the second switch unit 213→the current detection element 211→a negative electrode of the electrochemical cell 230.

The first detection unit 221 and the second detection unit 222 share the current detection element 211, and both detect a voltage at two ends of the current detection element 211 to implement closing or opening of the loop. Specifically, the first detection unit 221 includes a power supply terminal (a VDD terminal), a control terminal 3, and two detection terminals (a detection terminal 1 and a detection terminal 2). The VDD terminal of the first detection unit 221 is electrically connected to the first output terminal P+, to supply power to the first detection unit 221, thereby providing an operating voltage and current for the first detection unit 221, and ensuring normal operation of the first detection unit 221. The two detection terminals of the first detection unit 221 are electrically connected to two terminals (a terminal 1 and a terminal 2) of the current detection element 211 respectively, to detect the voltage at the two ends of the current detection element 211. The control terminal 3 of the first detection unit 221 is electrically connected to a terminal 3 of the first switch unit 212, to control the first switch unit 212 to be closed or opened, thereby controlling the loop to be closed or opened. Likewise, the second detection unit 222 includes a power supply terminal (a VDD terminal), a control terminal 3, and two detection terminals (a terminal 1 and a terminal 2). The VDD terminal of the second detection unit 222 is electrically connected to the first output terminal P+, to supply power to the second detection unit 222, thereby providing an operating voltage and current for the second detection unit 222, and ensuring normal operation of the second detection unit 222. The two detection terminals of the second detection unit 222 are electrically connected to the two terminals (the terminal 1 and the terminal 2) of the current detection element 211 respectively, to detect the voltage at the two ends of the current detection element 211. The control terminal 3 of the second detection unit 222 is electrically connected to a terminal 3 of the second switch unit 213, to control the second switch unit 213 to be closed or opened, thereby controlling the loop to be closed or opened.

The first detection unit 221 may be understood as the first-detection unit described above, and the second detection unit 222 may be understood as the second-detection unit described above. Alternatively, the first detection unit 221 may be understood as the second-detection unit described above, and the second detection unit 222 may be understood as the first-detection unit described above. This is not limited in this embodiment of this application. For ease of description, the first detection unit 221 may be used as the first-detection unit, and the second detection unit 222 may be used as the second-detection unit. In addition, for ease of differentiation, a preset overcurrent detection voltage threshold of the first detection unit 221 is denoted by $U_1$, a preset overcurrent detection voltage threshold at two ends of the second detection unit 222 is denoted by $U_2$, and the voltage at the two ends of the current detection element 211 is denoted by $U_0$.

Specifically, the first detection unit 221 is configured to detect the voltage $U_0$ at the two ends of the current detection element 211. If $U_0$ is greater than $U_1$, the first detection unit 221 sends a control signal to the first switch unit 212 to open the first switch unit 212, thereby opening the loop, so as to implement overcurrent protection. Likewise, the second detection unit 222 is also configured to detect the voltage $U_0$ at the two ends of the current detection element 211. If the first detection unit 221 fails, even if $U_0$ is greater than $U_1$, the loop cannot be opened in a timely manner, and the electrochemical cell continues to be charged or discharged, until $U_0$ is greater than $U_2$; when $U_0$ is greater than $U_2$, the second detection unit 222 sends a control signal to the second switch unit 213 to open the second switch unit 213, thereby opening the loop, so as to implement overcurrent protection.

To sum up, the battery protection circuit provided in this embodiment of this application includes: the first detection unit; the second detection unit; and the current detection element, the first switch unit, and the second switch unit that are configured to connect to the electrochemical cell in series, so that the current detection element, the first switch unit, the second switch unit, the electrochemical cell, and the load or the power supply form the loop. The first detection unit corresponds to the first switch unit, and the second detection unit corresponds to the second switch unit. Each detection unit controls, based on the detected voltage at the two ends of the same current detection element, a corresponding switch unit to be closed or opened, so as to control the loop to be closed or opened. The first detection unit and the second detection unit detect the voltage at the two ends of the same current detection element to detect a current passing through the electrochemical cell, so that a quantity of current detection elements in the battery protection circuit can be effectively reduced, to reduce impedance of the battery protection circuit. In this way, a loss of a battery protection board is reduced, thereby reducing costs. Especially as a current intelligent terminal has an increasingly large loss and an increasingly high charging speed, reducing a loss of a battery protection board is particularly important.

Figure 3:
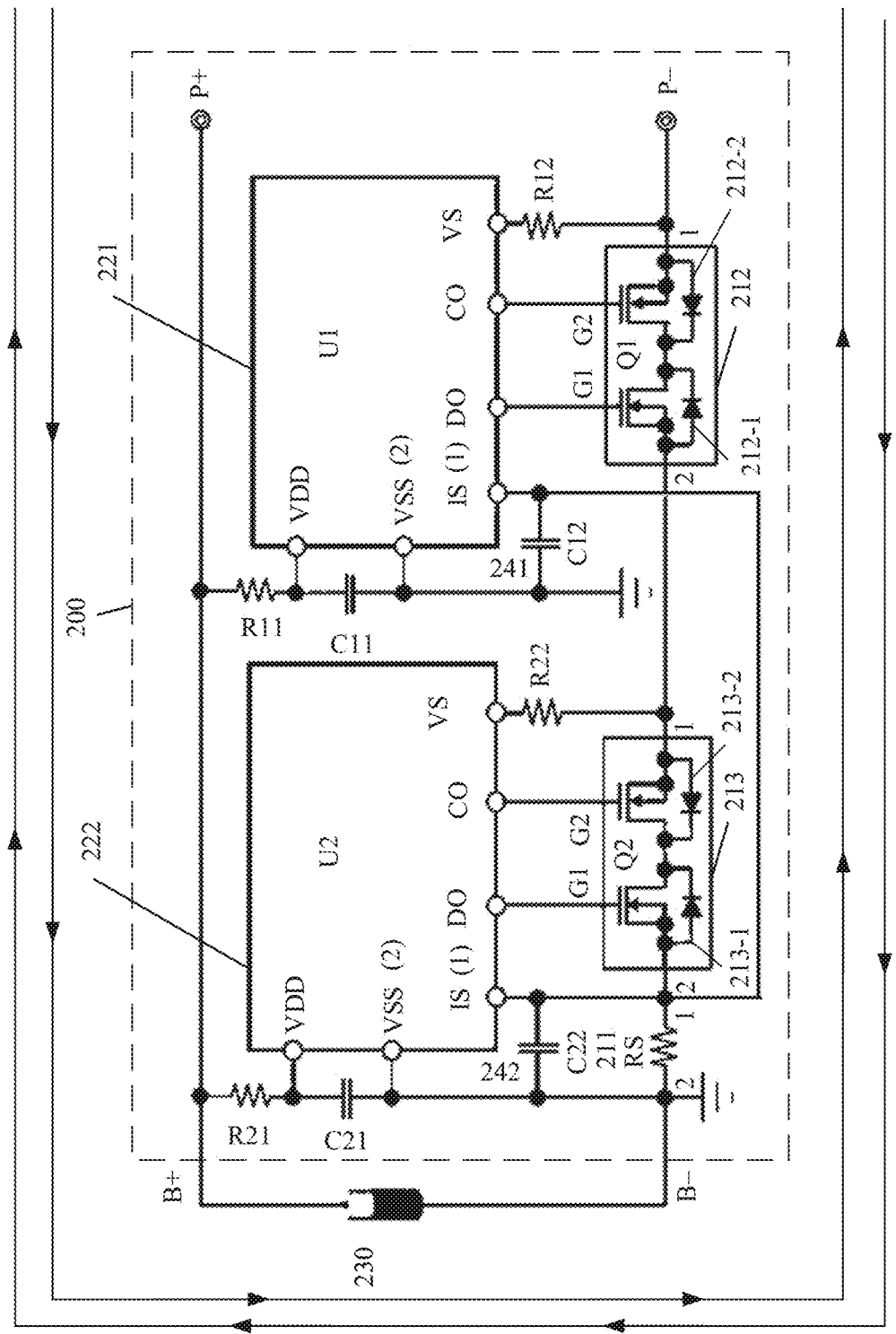
FIG. 3 is a schematic circuit diagram of a battery protection circuit according to an embodiment of this application.
Figure 4:
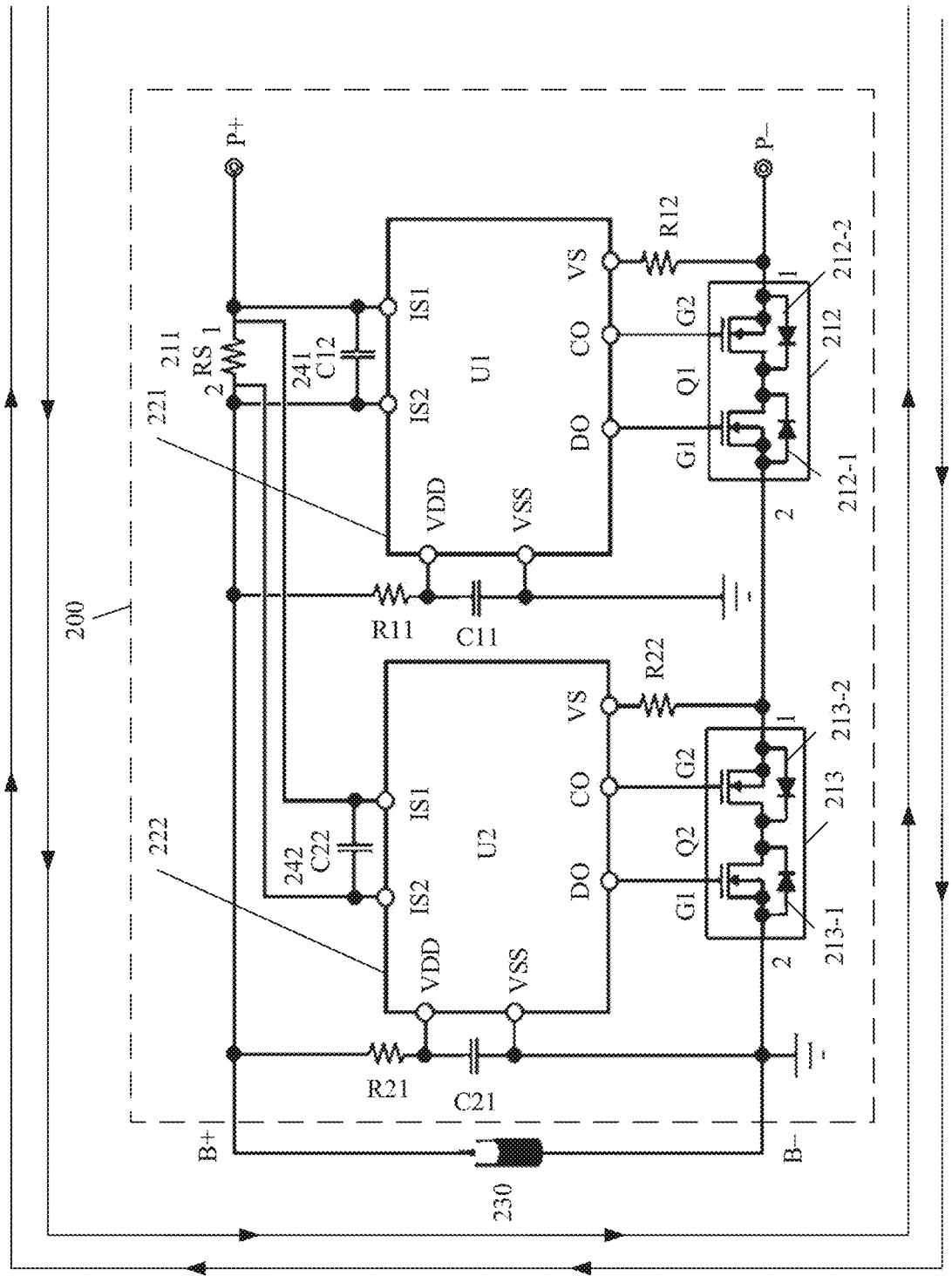
FIG. 4 is another schematic circuit diagram of a battery protection circuit according to an embodiment of this application.

Each of FIG. 3 and FIG. 4 is a schematic circuit diagram of a battery protection circuit according to an embodiment of this application. With reference to FIG. 2, referring to FIG. 3, the two detection terminals of each of the first detection unit 221 and the second detection unit 222 may be a VSS terminal and an IS terminal; referring to FIG. 4, both of the two detection terminals of each of the first detection unit 221 and the second detection unit 222 may be IS terminals. The VSS terminal represents a ground point or a negative electrode of a power supply, and the IS terminal represents a current detection terminal. It should be understood that the detection terminals shown in FIG. 3 and FIG. 4 are merely examples for description. Any terminal that can detect the voltage of the current detection element 211 may be used. No limitation is imposed herein.

Optionally, the current detection element 211 may be a detection resistor Rs.

For example, the current detection element 211 may alternatively be an element that can measure a current, such as a shunt or a Hall element.

It should be noted that the current detection element 211 may include one or more elements. This is not limited herein.

The following describes each functional module of the battery protection circuit 200 in detail with reference to FIG. 2 to FIG. 4.

First, a connection relationship between the current detection element 211, the first switch unit 212, and the second switch unit 213 is described.

Referring to FIG. 2, optionally, the first switch unit 212 includes a first terminal 1 and a second terminal 2, and the second switch unit includes a first terminal 1 and a second terminal 2. The first terminal 1 of the first switch unit 212 is electrically connected to one of the two output terminals. The second terminal 2 of the first switch unit is electrically connected to the first terminal 1 of the second switch unit. The second terminal 2 of the second switch unit is electrically connected to the first terminal 1 of the current detection element 211. The second terminal 2 of the current detection element 211 is configured to electrically connect to one terminal of the electrochemical cell 230.

For example, referring to FIG. 3, the first terminal 1 of the first switch unit 212 is electrically connected to the output terminal P−, and the second terminal 2 of the current detection element 211 is electrically connected to the negative electrode of the electrochemical cell 230.

For another example, referring to FIG. 4, the first terminal 1 of the first switch unit 212 is electrically connected to the output terminal P−, the second terminal of the current detection element 211 is configured to electrically connect to the positive electrode of the electrochemical cell 230, and the first terminal of the current detection element 211 is electrically connected to the output terminal P+.

It should be understood that the foregoing connection relationship between the current detection element 211, the first switch unit 212, and the second switch unit 213 is merely an example for description, and any implementation in which a serial connection relationship is formed between the three components in the loop may be used. This is not limited in the embodiments of this application. For example, the first switch unit 212 may be alternatively disposed between the current detection element 211 and the second switch unit 213, where one terminal of the current detection element 211 is electrically connected to the output terminal P−, and one terminal of the second switch unit 213 is configured to electrically connect to the negative electrode of the electrochemical cell 230.

The following uses FIG. 3 as an example to describe in detail a relationship between the first switch unit 212 and the first detection unit 221, and a relationship between the second switch unit 213 and the second detection unit 222.

Optionally, the control terminal 3 of the first detection unit 221 includes a discharging control terminal (DO terminal) and a charging control terminal (CO terminal), and the first switch unit 212 includes a first discharging switch element 212-1 and a first charging switch element 212-2. The first discharging switch element 212-1 includes a first terminal (G1 terminal). The first terminal (G1 terminal) of the first discharging switch element 212-1 is electrically connected to the discharging control terminal (DO terminal) of the first detection unit 221. The first charging switch element 212-2 includes a first terminal (G2 terminal). The first terminal (G2 terminal) of the first charging switch element 212-2 is electrically connected to the charging control terminal (CO terminal) of the first detection unit 221.

The control terminal 3 of the second detection unit 222 includes a discharging control terminal (DO terminal) and a charging control terminal (CO terminal), and the second switch unit 213 includes a second discharging switch element 213-1 and a second charging switch element 213-2. The second discharging switch element 213-1 includes a first terminal (G1 terminal). The first terminal (G1 terminal) of the second discharging switch element 213-1 is electrically connected to the discharging control terminal (DO terminal) of the second detection unit 222. The second charging switch element 213-2 includes a first terminal (G2 terminal). The first terminal (G2 terminal) of the second charging switch element 212-2 is electrically connected to the charging control terminal (CO terminal) of the second detection unit 222.

The discharging control terminal is configured to control the charging loop, and the charging control terminal is configured to control the charging loop. For example, the discharging switch element and the charging switch element may be metal-oxide-semiconductor (metal-oxide-semiconductor, MOS) transistors.

During charging, if the first detection unit 221 detects that the voltage $U_0$ at the two ends of Rs is greater than $U_1$, the first detection unit 221 outputs a control signal to the G2 terminal by using the CO terminal, to open the first charging switch element 212-2, thereby opening the charging loop. Likewise, if the second detection unit 222 detects that the voltage $U_0$ at the two ends of Rs is greater than $U_2$, the second detection unit 222 outputs a control signal to the G2 terminal by using the CO terminal, to open the second charging switch element 213-2, thereby opening the charging loop.

In the discharging loop, if the first detection unit 221 detects that the voltage $U_0$ at the two ends of Rs is greater than $U_1$, the first detection unit 221 outputs a control signal to the G1 terminal by using the DO terminal, to open the first discharging switch element 212-1, thereby opening the discharging loop. Likewise, if the second detection unit 222 detects that the voltage $U_0$ at the two ends of Rs is greater than $U_2$, the second detection unit 222 outputs a control signal to the G1 terminal by using the DO terminal, to open the discharging control MOS transistor, thereby opening the discharging loop.

Optionally, referring to FIG. 3 and FIG. 4, the first detection unit 221 further includes a VS (voltage sense) terminal. The VS terminal represents a voltage detection terminal. The VS terminal may be connected to the first terminal 1 of the first switch unit 212 by using a resistor $R_{12}$ or directly, to detect a voltage of the first terminal 1 of the first switch unit 212. Likewise, the second detection unit 222 further includes a VS terminal, and the VS terminal may be connected to the first terminal 1 of the second switch unit 213 by using a resistor $R_{22}$ or directly, to detect a voltage of the first terminal 1 of the second switch unit 213.

During current detection, to reduce interference clutter, of detected signals at the two ends of the current detection element, between the two terminals (for example, the IS terminal and the VSS terminal in FIG. 3) of the detection unit to improve circuit reliability, a filter capacitor may be connected in parallel between the two detection terminals in each detection unit that are configured to perform detection on the current detection element.

Optionally, the battery protection circuit 200 further includes:

a first filter capacitor 241, where the first filter capacitor 241 is connected in parallel between the two detection terminals in the first detection unit 221 that are configured to detect the voltage at the two ends of the current detection element 211.

Optionally, the battery protection circuit 200 further includes:

a second filter capacitor 242, where the second filter capacitor 242 is connected in parallel between the two detection terminals in the second detection unit 222 that are configured to detect the voltage at the two ends of the current detection element 211.

Still referring to FIG. 3, the terminals in the first detection unit 221 that are configured to detect the voltage at the two ends of Rs are the VSS terminal and the IS terminal, the first filter capacitor 241 is a capacitor $C_{12}$, and two terminals of the capacitor $C_{12}$ are respectively connected to the VSS terminal and IS terminal of the first detection unit 221. A voltage at two ends of the capacitor $C_{12}$ is a voltage between the VSS terminal and the IS terminal or the voltage at the two ends of Rs. Likewise, the detection terminals in the second detection unit 222 that are configured to detect the voltage at the two ends of Rs are the VSS terminal and the IS terminal, the second filter capacitor 242 is a capacitor $C_{22}$, and two terminals of the capacitor $C_{22}$ are respectively connected to the VSS terminal and IS terminal of the second detection unit 222. A voltage at two ends of the capacitor $C_{22}$ is a voltage between the VSS terminal and the IS terminal or the voltage at the two ends of Rs.

Still referring to FIG. 4, the detection terminals in the first detection unit 221 that are configured to detect the voltage at the two ends of Rs are an IS1 terminal and an IS2 terminal, the first filter capacitor 241 is a capacitor $C_{12}$, and two terminals of the capacitor $C_{12}$ are respectively connected to the IS1 terminal and IS2 terminal of the first detection unit 221. A voltage at two ends of the capacitor $C_{12}$ is a voltage between the IS1 terminal and the IS2 terminal or the voltage at the two ends of Rs. Likewise, the terminals in the second detection unit 222 that are configured to detect the voltage at the two ends of Rs are an IS1 terminal and an IS2 terminal, the second filter capacitor 242 is a capacitor $C_{22}$, and two terminals of the capacitor $C_{22}$ are respectively connected to the IS1 terminal and IS2 terminal of the second detection unit 222. A voltage at two ends of the capacitor $C_{22}$ is a voltage between the IS1 terminal and the IS2 terminal or the voltage at the two ends of Rs.

Although impedance in the circuit can be reduced by sharing one current detection element by the first detection unit and the second detection unit, if the two detection terminals of the first detection unit or the second detection unit are short-circuited or the two terminals of the filter capacitor are short-circuited, it is possible that overcurrent protection of the battery protection circuit cannot be implemented. Using FIG. 3 and a charging process as an example, if a short circuit occurs between the VSS terminal and IS terminal of the first detection unit, a current no longer flows through the resistor Rs, and a current flow direction is as follows: the terminal P+→the electrochemical cell 230→the VSS terminal→the IS terminal→the second switch unit 213→the first switch unit 212→the terminal P-. In this case, the voltage at the two ends of the resistor Rs is 0, and the first detection unit may be burnt out. Moreover, because the voltage at the two ends of the resistor Rs is 0, the second detection unit cannot detect the voltage at the two ends of the resistor Rs, and the second protection cannot be implemented. If a short circuit occurs between the two terminals of the first filter capacitor 241, a current no longer flows through the resistor Rs, and a current flow direction is as follows: the terminal P+→the electrochemical cell 230→the capacitor $C_{12}$→the second switch unit 213→the first switch unit 212→the terminal P-. In this case, the voltage at the two ends of the resistor Rs is 0, and the capacitor $C_{12}$ may be burnt out. Moreover, because the voltage at the two ends of the resistor Rs is 0, the second detection unit cannot detect the voltage at the two ends of the resistor Rs, and the second protection for a battery cannot be implemented.

Therefore, to avoid a phenomenon in which a failure of one detection unit affects an overcurrent protection function of the other detection unit and causes burnout of an element, in the embodiments of this application, a fault isolation unit may be further disposed in the battery protection circuit, so that a current can still flow through the current detection element when, for example, the two detection terminals of the first detection unit or the second detection unit are short-circuited or the two terminals of the filter capacitor are short-circuited, to implement double protection for the battery.

The following describes the fault isolation unit in detail.

Figure 5A:
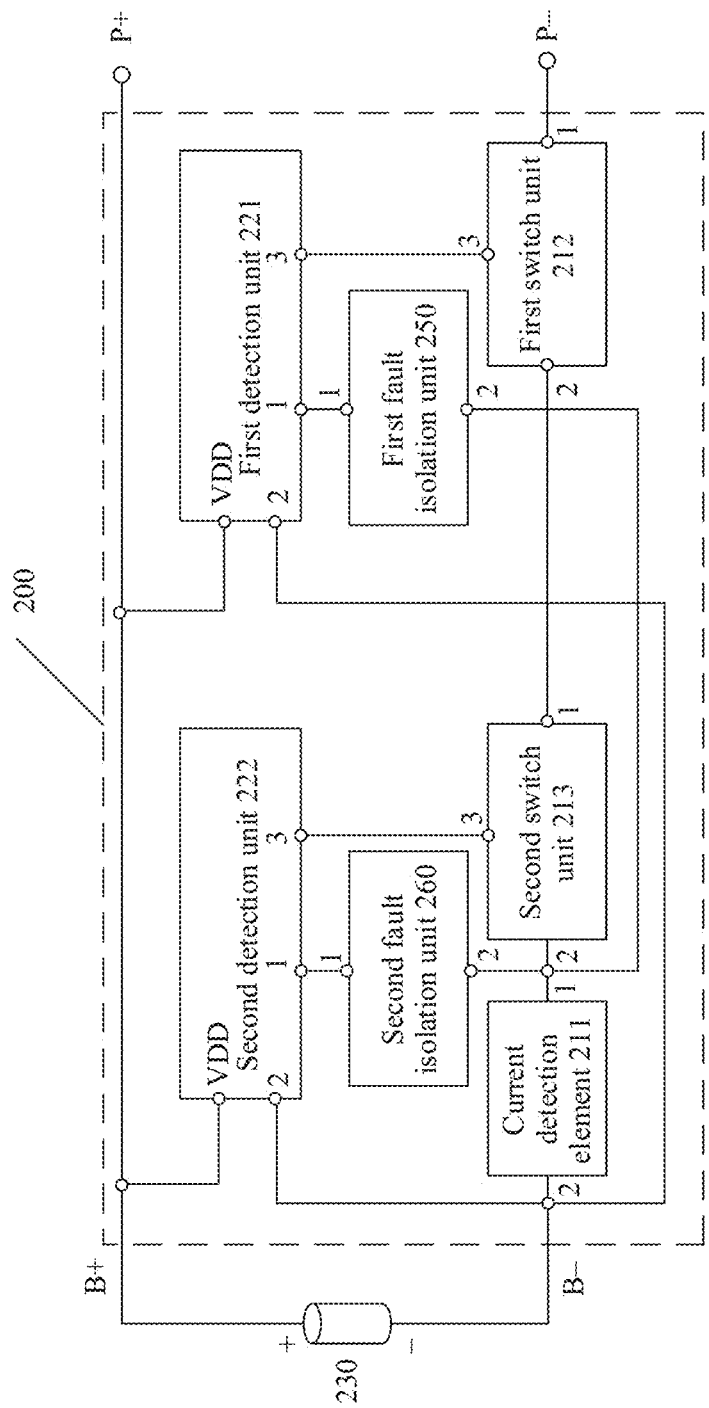
FIG. 5(a) to FIG. 5(c) are another schematic structural diagram of a battery protection circuit according to an embodiment of this application.
Figure 5B:
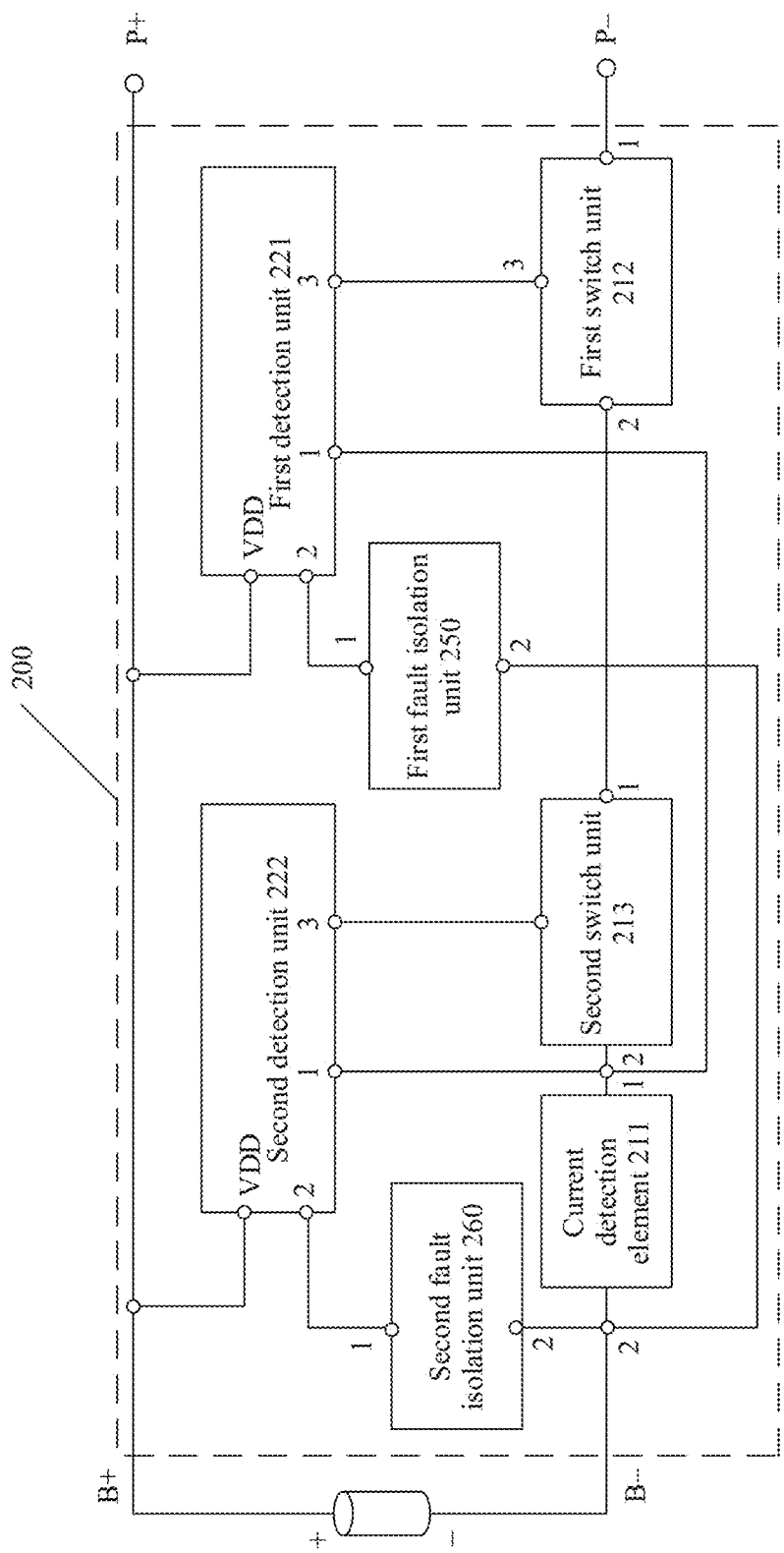
Figure 5C:
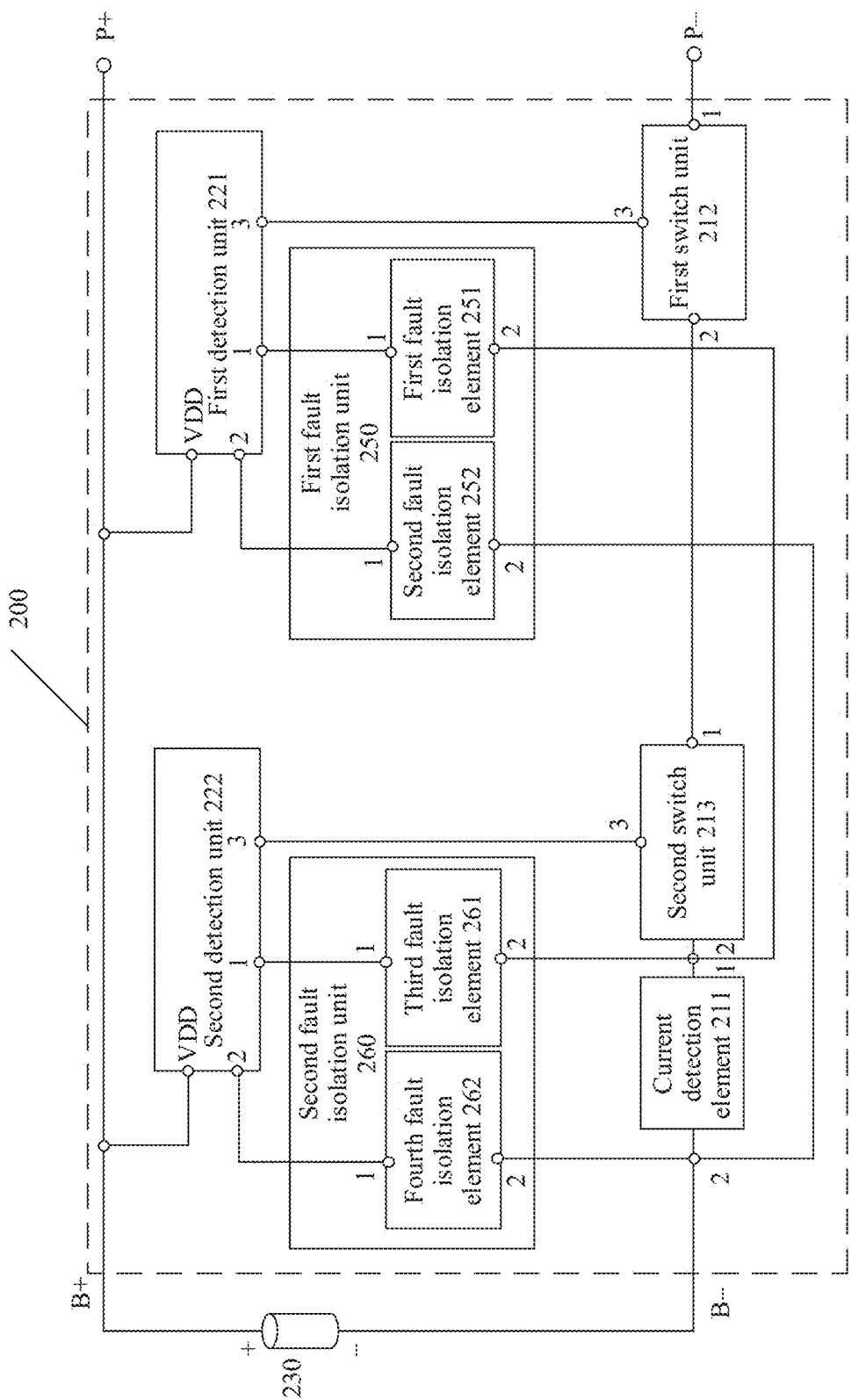

Referring to FIG. 5(a) to FIG. 5(c), optionally, the battery protection circuit 200 further includes:

a first fault isolation unit 250, electrically connected to the first detection unit 221 and the current detection element 221 separately, so that the two ends of the current detection element 221 are not short-circuited when a circuit electrically connected to a first terminal 1 of the first fault isolation unit 250 is short-circuited, where the first terminal 1 of the first fault isolation unit 250 is electrically connected to one detection terminal of the first detection unit 221.

FIG. 5(a) and FIG. 5(b) show cases in which the first fault isolation unit 250 is electrically connected to one detection terminal of the first detection unit 221 and one terminal of the current detection element 211. A difference lies in the following: The first fault isolation unit 250 shown in FIG. 5(a) is electrically connected to the detection terminal 1 of the first detection unit 221 and the terminal 1 of the current detection element 211 separately, and the detection terminal, of the first detection unit 221, electrically connected to the first terminal 1 of the first fault isolation unit 250 is the detection terminal 1; the first fault isolation unit 250 shown in FIG. 5(b) is electrically connected to the detection terminal 2 of the first detection unit 221 and the terminal 2 of the current detection element 211, and the detection terminal, of the first detection unit 221, electrically connected to the first terminal 1 of the first fault isolation unit 250 is the detection terminal 2. FIG. 5(c) shows a case in which the first fault isolation unit 250 is electrically connected to the two detection terminals of the first detection unit 221 and the two terminals of the current detection element 211 separately, where the first fault isolation unit 250 includes two fault isolation elements, and the first terminal 1 of the first fault isolation unit 250 may be a first terminal 1 of either fault isolation element.

For example, the circuit electrically connected to the first terminal of the first fault isolation unit 250 may be various possible circuits. For example, the circuit may be a circuit between the two detection terminals (for example, the VSS terminal and the IS terminal shown in FIG. 3) in the first detection unit 221 that are configured to detect the voltage of the current detection element 211. For another example, the circuit may alternatively be the first filter capacitor. This is not limited in this embodiment of this application.

For example, the first fault isolation unit 250 may be a unit module that includes one or more elements.

For the first fault isolation unit 250, the embodiments of this application provide two possible manners (namely, a manner 1 and a manner 2), so that the two ends of the current detection element 211 are not short-circuited. In the manner 1, the first fault isolation unit 250 includes one fault isolation element, corresponding to FIG. 5(*a*) and FIG. 5(*b*). In the manner 2, the first fault isolation unit 250 includes two fault isolation elements, corresponding to FIG. 5(*c*). It should be understood that the two manners are merely examples for description, and shall not constitute any limitation on the embodiments of this application.

Manner 1:

In this manner, the first fault isolation unit 250 is electrically connected to one detection terminal of the first detection unit 221 and one terminal of the current detection element 211 separately, so that the second detection unit 222 can work normally when, for example, a short circuit occurs between the two detection terminals of the first detection unit 221 or the first filter capacitor is short-circuited.

Figure 6:
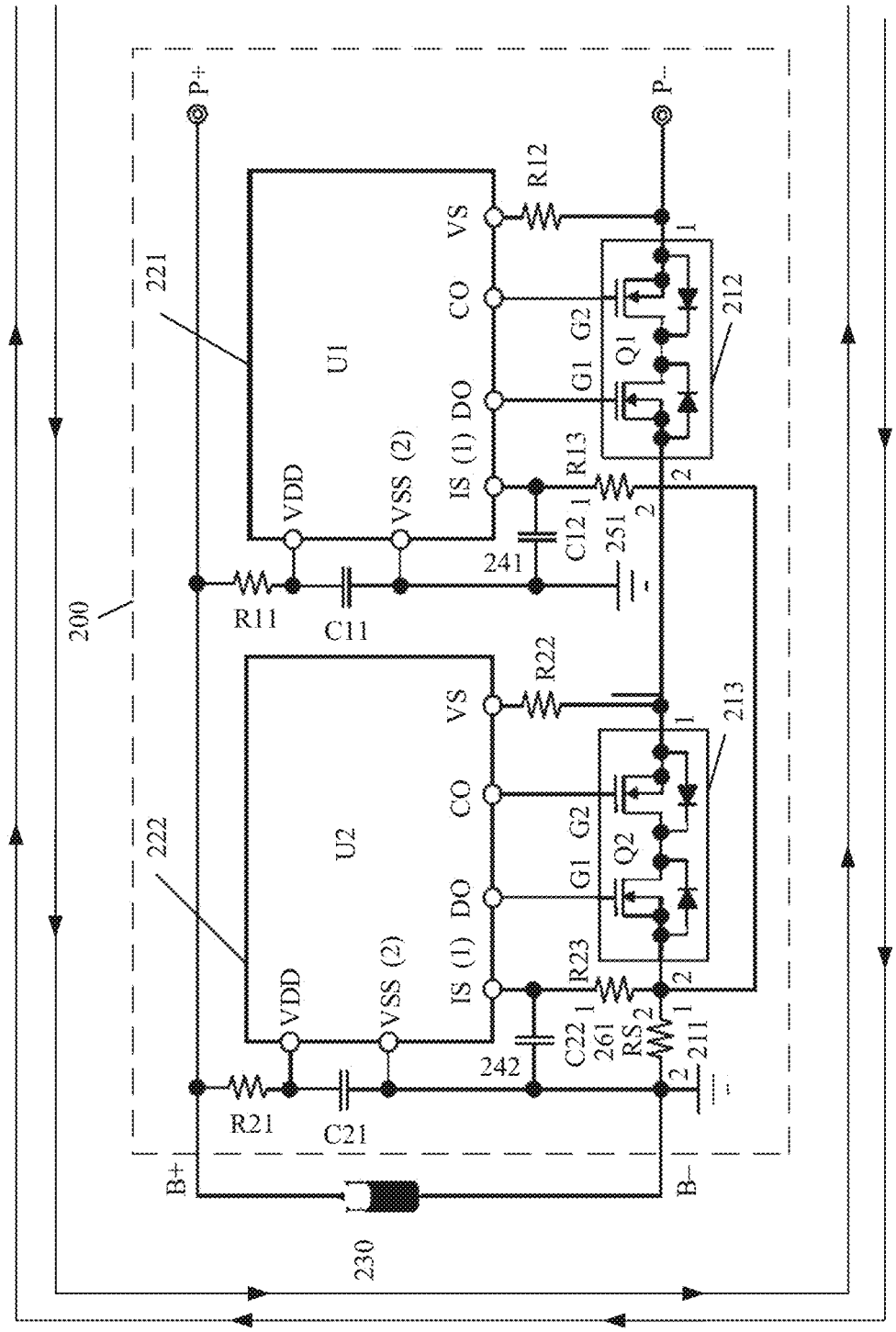
FIG. 6 is another schematic circuit diagram of a battery protection circuit according to an embodiment of this application.
Figure 7:
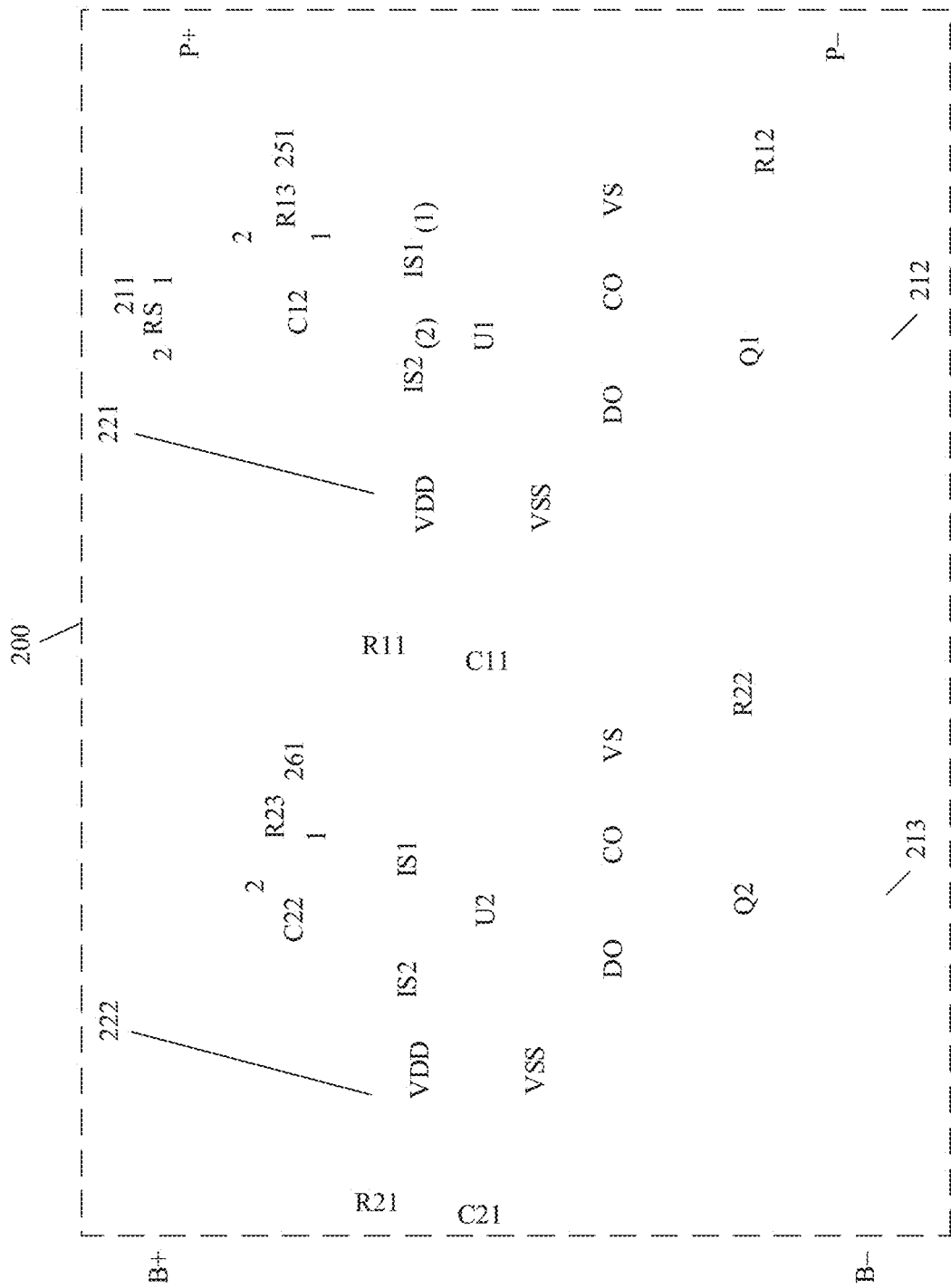
FIG. 7 is another schematic circuit diagram of a battery protection circuit according to an embodiment of this application.

Each of FIG. 6 and FIG. 7 is a schematic circuit diagram of a battery protection circuit. Referring to FIG. 6 and FIG. 7, in a possible implementation, the first fault isolation unit 250 includes a first fault isolation element 251. The first fault isolation element 251 includes a first terminal 1 and a second terminal 2. The first terminal 1 of the first fault isolation element 251 is the first terminal of the first fault isolation unit 250. In addition, the two detection terminals of the first detection unit 221 include a first detection terminal (for example, an IS terminal in FIG. 6 or an IS1 terminal in FIG. 7) and a second detection terminal (for example, a VSS terminal in FIG. 6 or an IS2 terminal in FIG. 7), and the two terminals of the current detection element 211 include the first terminal 1 and the second terminal 2.

The first terminal 1 of the first fault isolation element 251 is electrically connected to the first detection terminal 1 of the first detection unit 221. The second terminal 2 of the first fault isolation element 251 is electrically connected to the first terminal 1 of the current detection element 211. The second terminal 2 of the current detection element 211 is electrically connected to the second detection terminal of the first detection unit 221.

For example, the first fault isolation element 251 may be a resistor $R_{13}$.

It should be noted that the first fault isolation element 251 may include one or more elements. This is not limited herein.

In the following, a charging process and the battery protection circuit shown in FIG. 6 are used as an example to describe in detail a working principle process of the battery protection circuit that includes the first fault isolation element 251. A working principle of the battery protection circuit during discharging is similar to that of the battery protection circuit during charging. For brevity, details are not described again.

Figure 8:
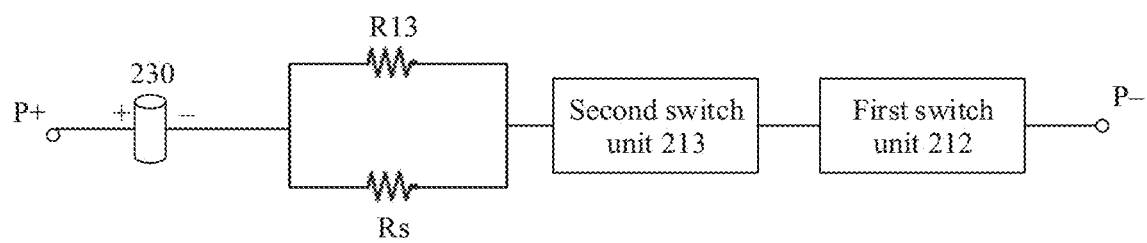
FIG. 8 is another schematic structural diagram of a battery protection circuit according to an embodiment of this application.

It is assumed that a short circuit occurs between the IS terminal and VSS terminal of the first detection unit 221. Referring to FIG. 8, there are two branches of a current direction in the charging loop. A first branch is as follows: the terminal P+→the electrochemical cell 230→$R_{13}$→the second switch unit 213→the first switch unit 212→the terminal P−, where a current passing through the electrochemical cell 230 flows partly to $R_{13}$ through the VSS terminal and the IS terminal. A second branch is as follows: the terminal P+→the electrochemical cell 230→Rs→the second switch unit 213→the first switch unit 212→the terminal P−. In other words, in this case, a parallel connection relationship is formed between $R_{13}$ and Rs. In this way, even if a short circuit occurs between the VSS terminal and the IS terminal, because a current passes through the resistor $R_{13}$ in the first branch, the current flowing out of the electrochemical cell 230 may pass through Rs. Therefore, a current passing through Rs is not 0, and a voltage definitely exists at the two ends of Rs, so that the second detection unit 222 can detect the voltage at the two ends of Rs (which is also a voltage at two ends of $R_{13}$ connected in parallel to Rs). Because a total current of a parallel circuit that includes $R_{13}$ and Rs is the current passing through the electrochemical cell 230, and the voltage that is at the two ends of Rs and that is detected by the second detection unit 222 and equivalent impedance of the circuit formed through a parallel connection between $R_{13}$ and Rs are known, the current passing through the electrochemical cell 230 can be obtained. Therefore, the charging loop can be controlled to be closed or opened, by detecting the voltage at the two ends of Rs. This does not affect overcurrent protection of the second detection unit 222 and the second switch unit 213, and does not cause burnout of the first detection unit 221.

It is alternatively assumed that a short circuit occurs between the two terminals of the capacitor $C_{12}$. Still referring to FIG. 8, there are two branches of a current direction in the charging loop. A first branch is as follows: the terminal P+→the electrochemical cell 230→$R_{13}$→the second switch unit 213→the first switch unit 212→the terminal P−, where a part of a current passing through the electrochemical cell 230 flows to $R_{13}$ through $C_{12}$. A second branch is as follows: the terminal P+→the electrochemical cell 230→Rs→the second switch unit 213→the first switch unit 212→the terminal P−. Likewise, in this case, a parallel connection relationship is formed between $R_{13}$ and Rs. In this way, even if a short circuit occurs between the two terminals of the capacitor $C_{12}$, because a current passes through the resistor $R_{13}$ in the first branch, the current flowing out of the electrochemical cell 230 may pass through Rs. Therefore, a current passing through Rs is not 0, and a voltage definitely exists at the two ends of Rs, so that the VSS terminal and IS terminal of the second detection unit 222 can detect the voltage at the two ends of Rs (which is also a voltage at two ends of $R_{13}$ connected in parallel to Rs). Because a total current of a parallel circuit that includes $R_{13}$ and Rs is the current passing through the electrochemical cell 230, and the voltage that is at the two ends of Rs and that is detected by the second detection unit 222 and equivalent impedance of the circuit formed through a parallel connection between $R_{13}$ and Rs are known, the current passing through the electrochemical cell 230 can be obtained. Therefore, the charging loop can be controlled to be closed or opened, by detecting the voltage at the two ends of Rs. This does not affect overcurrent protection of the second detection unit 222 and the second switch unit 213, and does not cause burnout of the first filter capacitor 241.

Manner 2:

In this manner, the first fault isolation unit 250 includes two fault isolation elements, and each fault isolation element is electrically connected to one detection terminal of the first detection unit 221 and one terminal of the current detection element 211, so that the second detection unit 222 can work normally when, for example, the first filter capacitor is short-circuited or a short circuit occurs between the two detection terminals of the first detection unit 221.

Figure 9:
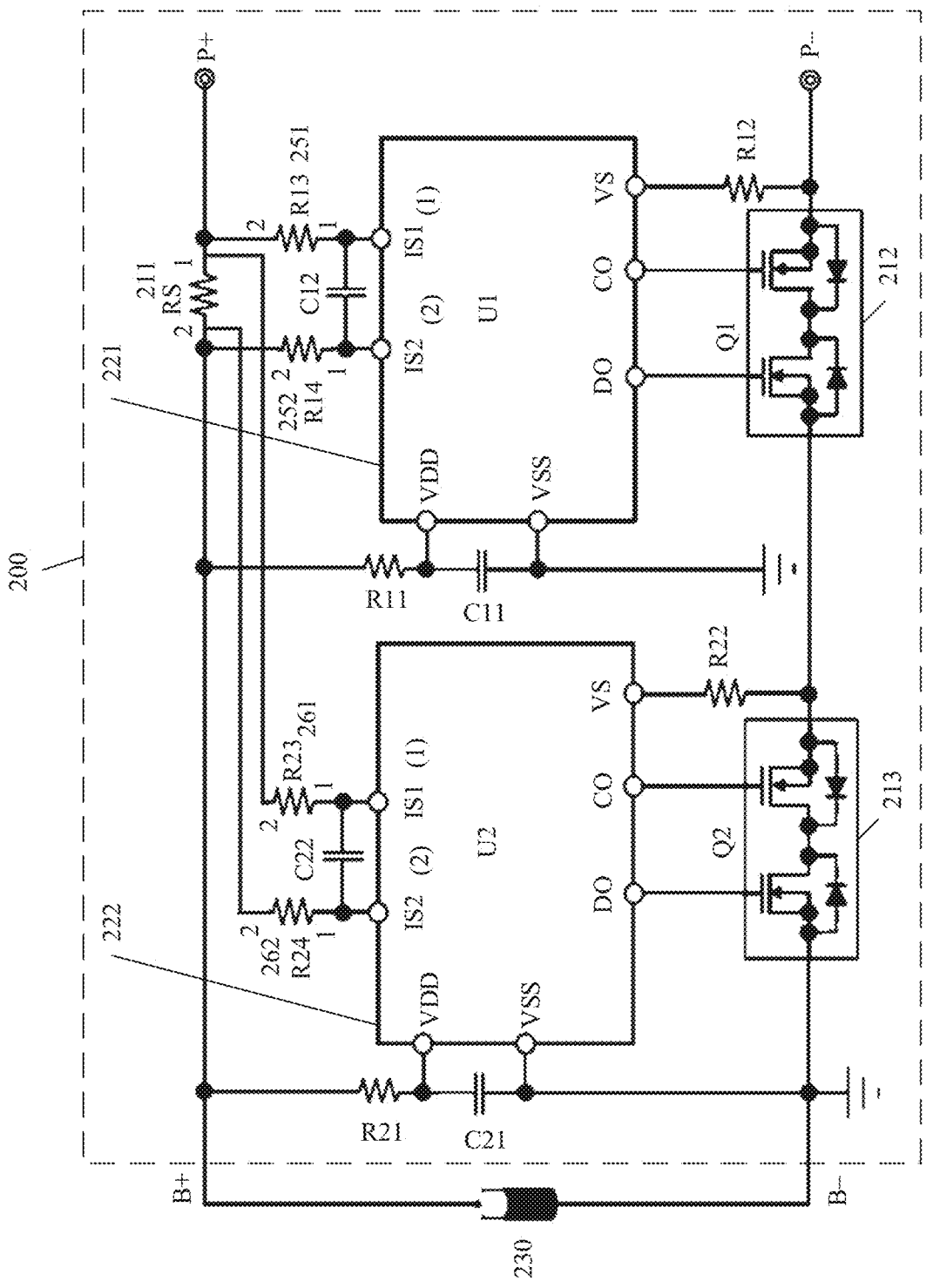
FIG. 9 is another schematic circuit diagram of a battery protection circuit according to an embodiment of this application.
Figure 10:
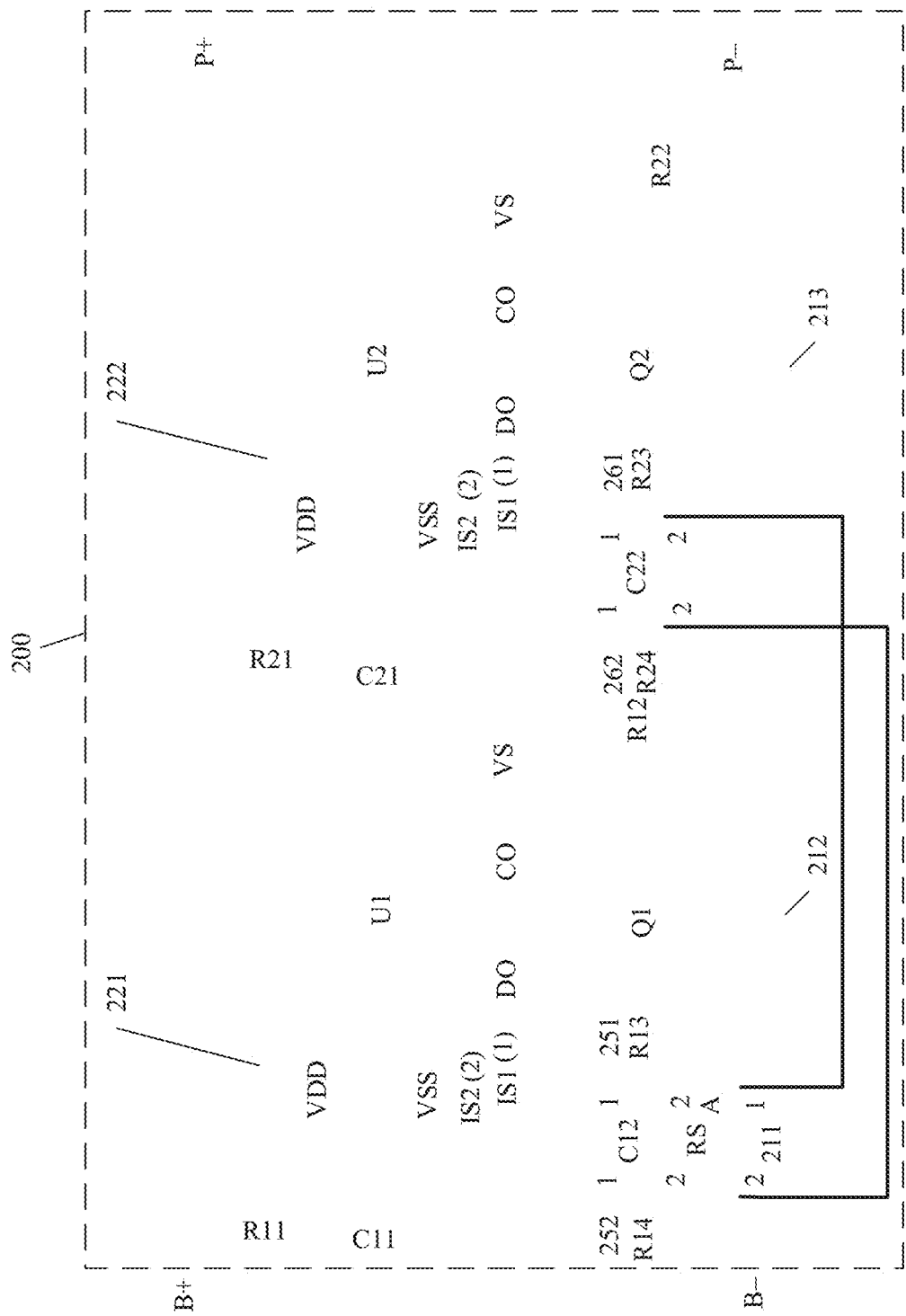
FIG. 10 is still another schematic circuit diagram of a battery protection circuit according to an embodiment of this application.
Figure 11:
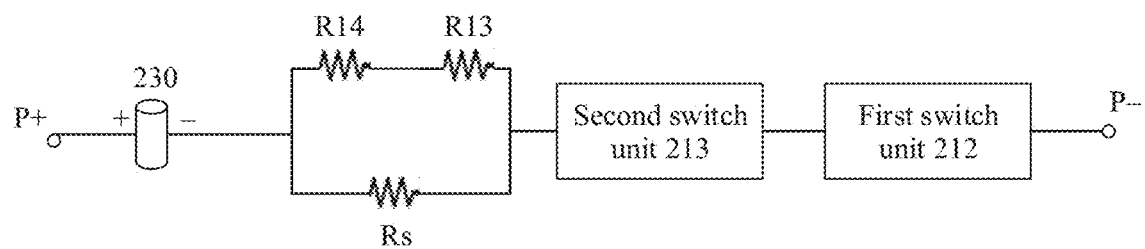
FIG. 11 is another schematic structural diagram of a battery protection circuit according to an embodiment of this application.

Each of FIG. 9 and FIG. 10 is a schematic circuit diagram of a battery protection circuit. It should be noted that positions of the two detection units are exchanged in FIG. 10, showing another possible connection relationship between the two detection units and another element.

Referring to FIG. 9 and FIG. 10, in a possible implementation, the first fault isolation unit 250 includes a first fault isolation element 251 and a second fault isolation element 252. The first fault isolation element 251 includes a first terminal 1 and a second terminal 2. The second fault isolation element 252 includes a first terminal 1 and a second terminal 2. The first terminal 1 of the first fault isolation element 251 or the first terminal 1 of the second fault isolation element 252 is the first terminal 1 of the first fault isolation unit 250. In addition, the two detection terminals of the first detection unit 221 include a first detection terminal (for example, an IS1 terminal in FIG. 9 or FIG. 10) and a second detection terminal (for example, an IS2 terminal in FIG. 9 or FIG. 10), and the two terminals of the current detection element 211 include the first terminal 1 and the second terminal 2.

The first terminal 1 of the first fault isolation element 251 is electrically connected to the first detection terminal 1 of the first detection unit 221. The second terminal 2 of the first fault isolation element 251 is electrically connected to the first terminal 1 of the current detection element 211. The first terminal 1 of the second fault isolation element 252 is electrically connected to the second detection terminal 2 of the first detection unit 221. The second terminal 2 of the second fault isolation element 251 is electrically connected to the second terminal 2 of the current detection element. Both of the first detection terminal 1 and the second detection terminal 2 of the first detection unit 221 are current detection terminals.

For example, the first fault isolation element 251 may be a resistor $R_{13}$, and the second fault isolation element may be a resistor $R_{14}$.

It should be noted that each of the first fault isolation element 251 and the second fault isolation element 251 may include one or more elements. This is not limited herein.

A working principle is the same as that in the manner 1. In this manner, for example, when a short circuit occurs between the terminals IS1 and IS2 of the first detection unit 221 or a short circuit occurs between the two terminals of the first filter capacitor $C_{12}$, referring to FIG. 11, there are two branches of a current direction in the charging loop. A first branch is as follows: the terminal P+→the electrochemical cell 230→$R_{14}$→$R_{13}$→the second switch unit 213→the first switch unit 212→the terminal P−. A second branch is as follows: the terminal P+→the electrochemical cell 230→Rs→the second switch unit 213→the first switch unit 212→the terminal P−. In this case, a parallel connection relationship is formed between Rs, and $R_{14}$ and $R_{13}$. A current flowing out of the electrochemical cell 230 may pass through Rs, so that the second detection unit 222 can detect a voltage at the two ends of Rs. Because a total current of a parallel circuit that includes $R_{14}$, $R_{13}$, and Rs is the current passing through the electrochemical cell 230, and the voltage that is at the two ends of Rs and that is detected by the second detection unit 222 and equivalent impedance of the circuit formed through a parallel connection between Rs, and $R_{14}$ and $R_{13}$ are known, the current passing through the electrochemical cell 230 can be obtained. Therefore, the charging loop can be controlled to be closed or opened, by detecting the voltage at the two ends of Rs. This does not affect overcurrent protection of the second detection unit 222 and the second switch unit 213, and does not cause burnout of the first detection unit 221 or the first filter capacitor 241.

Therefore, in the battery protection circuit provided in the embodiments of this application, the first fault isolation unit electrically connected to the first detection unit and the current detection element is disposed. In some cases, for example, when a short circuit occurs between the two detection terminals in the first detection unit that are configured to detect the voltage at the two ends of the current detection element, or when a short circuit occurs between the two terminals of the first filter capacitor connected in parallel between the two detection terminals of the first detection unit that are configured to detect the voltage of the current detection element, because the first fault isolation unit is disposed, a current can still flow through the current detection element, to form a voltage at the two ends of the current detection element. The loop can be controlled to be closed or opened, by detecting the voltage at the two ends of the current detection element. This does not affect overcurrent protection of the second detection unit and the second switch unit, and does not cause burnout of the first detection unit or the first filter capacitor.

To ensure overcurrent protection reliability as far as possible, resistance values of the first fault isolation unit 250 and the current detection element 211 may be properly designed to make, as far as possible, an absolute value of a difference between a resistance value of the current detection element 211 and equivalent impedance of a circuit formed through a parallel connection between the first fault isolation unit 250 and the current detection element 211 be less than or equal to a preset value. Optionally, the preset value may be 50% of the resistance value of the current detection unit. Theoretically, the preset value should be as small as possible, because a smaller preset value can make a before-fault overcurrent protection effect be closer to an after-fault overcurrent protection effect, and indicates higher overcurrent protection reliability.

Optionally, the resistance value of the current detection element 211 is a milliohm-level resistance, and a resistance value of the first fault isolation unit 250 is an ohm-level resistance.

For example, common values of the current detection element 211 are 5 mΩ, 3 mΩ, 2 mΩ, and 1.5 mΩ.

Referring to the first fault isolation element 251 and the current detection element 211 in FIG. 6, an example in which the first fault isolation unit 250 includes the first fault isolation element 251 is used to describe a relationship between the resistance values of the first fault isolation unit 250 and the current detection element 211. It is assumed that $R_S$=5 mΩ, $R_{13}$=3.3Ω, and $U_2'$ is the preset overcurrent detection voltage threshold of the second detection unit 222. If $C_{12}$ is normal, a threshold of a current passing through the electrochemical cell 230 may be I'=$U_2'$/5 mΩ. If $C_{12}$ is short-circuited, Rs and $R_{13}$ are connected in parallel, and a resistance value obtained after the parallel connection is 4.99 ma Therefore, even if $C_{12}$ is short-circuited, a threshold of a current passing through the electrochemical cell 230 may be I'=$U_2$'/4.99 mΩ. It can be learned that a difference between the thresholds of a current passing through the electrochemical cell 230 that are obtained when $C_{12}$ is short-circuited and when $C_{12}$ is normal is quite small. In this way, a difference between current thresholds for overcurrent protection before and after a fault can be small as far as possible, to improve overcurrent protection reliability.

Likewise, if the first fault isolation unit 250 includes a plurality of elements, a relationship between a resistance value of the element connected in series to the plurality of elements and equivalent impedance of a circuit formed through a parallel connection to the current detection unit is similar to that described above, and details are not described again.

Therefore, in the battery protection circuit provided in the embodiments of this application, because the absolute value of the difference between the resistance value of the current detection element and the equivalent impedance of the circuit formed through the parallel connection between the first fault isolation circuit and the current detection element is less than or equal to the preset value, before and after some faults occur, for example, before and after a short circuit occurs between the two detection terminals in the first detection unit that are configured to detect the voltage at the two ends of the current detection element, or before and after a short circuit occurs between the two terminals of the first filter capacitor connected in parallel between the two detection terminals of the first detection unit, a difference between thresholds of a current passing through the electrochemical cell can be comparatively small. This can improve overcurrent protection reliability.

The foregoing describes the embodiments in which the first fault isolation unit is disposed between the first detection unit and the current detection element. Likewise, a second fault isolation unit may also be disposed between the second detection unit and the current detection element, to implement double protection for the battery.

Still referring to FIG. 5(a) to FIG. 5(c), optionally, the battery protection circuit 200 further includes:

a second fault isolation unit 260, electrically connected to the second detection unit 222 and the current detection element 221 separately, so that the two ends of the current detection element 221 are not short-circuited when a circuit electrically connected to a first terminal 1 of the second fault isolation unit 260 is short-circuited, where the first terminal 1 of the second fault isolation unit 260 is electrically connected to one detection terminal of the second detection unit 222.

In FIG. 5(a) and FIG. 5(b) show cases in which the second fault isolation unit 260 is electrically connected to one detection terminal of the second detection unit 222 and one terminal of the current detection element 211. A difference lies in the following: The second fault isolation unit 260 shown in FIG. 5(a) is electrically connected to the detection terminal 1 of the second detection unit 222 and the terminal 1 of the current detection element 211 separately, and the detection terminal, of the second detection unit 221, electrically connected to the first terminal 1 of the second fault isolation unit 260 is the detection terminal 1; the second fault isolation unit 260 shown in FIG. 5(b) is electrically connected to the detection terminal 2 of the second detection unit 222 and the terminal 2 of the current detection element 211, and the detection terminal, of the second detection unit 222, electrically connected to the first terminal 1 of the second fault isolation unit 260 is the detection terminal 2.

FIG. 5(c) shows a case in which the second fault isolation unit 260 is electrically connected to the two detection terminals of the second detection unit 222 and the two terminals of the current detection element 211, where the second fault isolation unit 260 includes two fault isolation elements, and the first terminal 1 of the second fault isolation unit 260 may be a first terminal 1 of either fault isolation element.

For example, the circuit electrically connected to the first terminal of the second fault isolation unit 260 may be various possible circuits. For example, the circuit may be a circuit between the two detection terminals (for example, the IS1 terminal and the IS2 terminal shown in FIG. 3) in the second detection unit 222 that are configured to detect the voltage of the current detection element 211. For another example, the circuit may alternatively be the second filter capacitor. This is not limited in the embodiments of this application.

For example, the second fault isolation unit 260 may be a unit module that includes one or more elements.

Disposition is similar to that of the first fault isolation unit 250. For example, for the second fault isolation unit 260, the embodiments of this application also provide two possible implementations (namely, a manner 3 and a manner 4), so that the two ends of the current detection element 211 are not short-circuited. In the manner 3, the second fault isolation unit 260 includes one fault isolation element, corresponding to FIG. 5(a) and FIG. 5(b). In the manner 4, the second fault isolation unit 260 includes two fault isolation elements, corresponding to FIG. 5(c). It should be understood that the two manners are merely examples for description, and shall not constitute any limitation on the embodiments of this application.

Manner 3:

In this manner, the second fault isolation unit 260 is electrically connected to one detection terminal of the second detection unit 222 and one terminal of the current detection element 211 separately, so that the first detection unit 221 can work normally when, for example, a short circuit occurs between the two detection terminals of the second detection unit 222 or the second filter capacitor 242 is short-circuited.

Still referring to FIG. 6 and FIG. 7, in a possible implementation, the second fault isolation unit 260 includes a third fault isolation element 261. The third fault isolation element 261 includes a first terminal 1 and a second terminal 2. The first terminal 1 of the third fault isolation element 261 is the first terminal 1 of the second fault isolation unit 260. In addition, the two detection terminals of the second detection unit 222 include a first detection terminal (for example, an IS terminal in FIG. 6 or an IS1 terminal in FIG. 7) and a second detection terminal (for example, a VSS terminal in FIG. 6 or an IS2 terminal in FIG. 7), and the two terminals of the current detection element 221 include the first terminal 1 and the second terminal 2. The first terminal 1 of the third fault isolation element 261 is electrically connected to the first terminal 1 of the second detection unit 222. The second terminal 2 of the third fault isolation element 261 is electrically connected to the first terminal 1 of the current detection element 211. The second terminal 2 of the current detection element 211 is electrically connected to the second terminal of the second detection unit 222.

For example, the third fault isolation element 261 may be a resistor $R_{23}$.

It should be noted that the third fault isolation element 261 may include one or more elements. This is not limited herein.

In the following, a charging process and the battery protection circuit shown in FIG. 6 are used as an example to describe in detail a working principle process of the battery protection circuit that includes the third fault isolation element 261. A working principle of the battery protection circuit during discharging is similar to that of the battery protection circuit during charging. For brevity, details are not described again.

Figure 12:
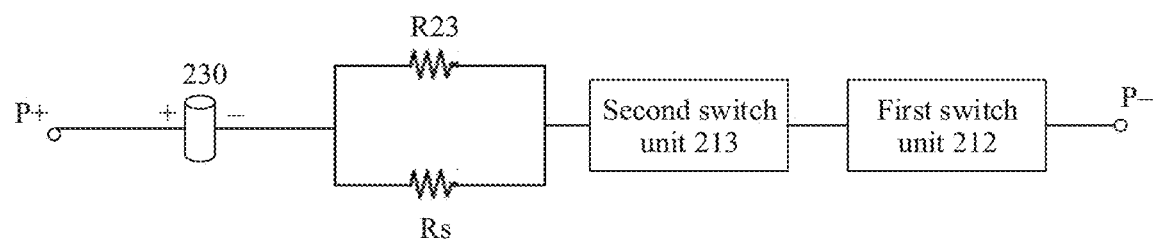
FIG. 12 is another schematic structural diagram of a battery protection circuit according to an embodiment of this application.
Figure 13:
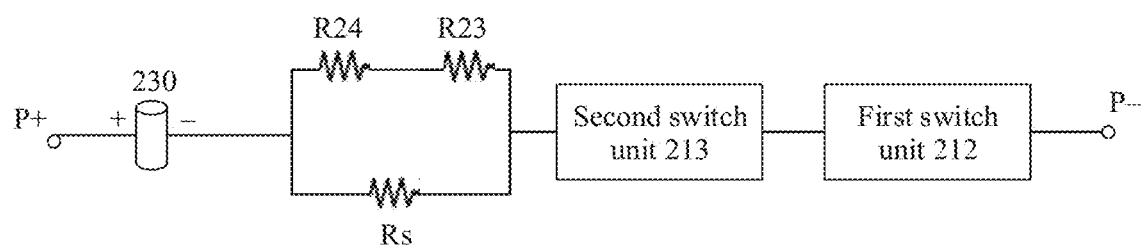
FIG. 13 is still another schematic structural diagram of a battery protection circuit according to an embodiment of this application.

It is assumed that a short circuit occurs between the IS terminal and VSS terminal of the second detection unit 222. Referring to FIG. 12, there are two branches of a current direction in the charging loop. A first branch is as follows: the terminal P+→the electrochemical cell 230→$R_{23}$→the second switch unit 213→the first switch unit 212→P−, where a current passing through the electrochemical cell 230 flows partly to $R_{23}$ through the VSS terminal and the IS terminal. A second branch is as follows: the terminal P+→the electrochemical cell 230→Rs→the second switch unit 213→the first switch unit 212→the terminal P−. In other words, in this case, a parallel connection relationship is formed between $R_{23}$ and Rs. In this way, even if a short circuit occurs between the VSS terminal and the IS terminal, because a current passes through the resistor $R_{23}$ in the first branch, the current flowing out of the electrochemical cell 230 may pass through Rs. Therefore, a current passing through Rs is not 0, and a voltage definitely exists at the two ends of Rs, so that the first detection unit 221 can detect the voltage at the two ends of Rs (which is also a voltage at two ends of $R_{23}$ connected in parallel to Rs). Because a total current of a parallel circuit that includes $R_{23}$ and Rs is the current passing through the electrochemical cell 230, and the voltage that is at the two ends of Rs and that is detected by the first detection unit 221 and equivalent impedance of the circuit formed through a parallel connection between $R_{23}$ and Rs are known, the current passing through the electrochemical cell 230 can be obtained. Therefore, the charging loop can be controlled to be closed or opened, by detecting the voltage at the two ends of Rs. This does not affect overcurrent protection of the first detection unit 221 and the first switch unit 212, and does not cause burnout of the second detection unit 222.

It is alternatively assumed that a short circuit occurs between the two terminals of the capacitor $C_{22}$. Still referring to FIG. 12, there are two branches of a current direction in the charging loop. A first branch is as follows: the terminal P+→the electrochemical cell 230→$R_{23}$→the second switch unit 213→the first switch unit 212→P−, where a current passing through the electrochemical cell 230 flows partly to $R_{23}$ through $C_{22}$. A second branch is as follows: the terminal P+→the electrochemical cell 230→Rs→the second switch unit 213→the first switch unit 212→the terminal P−. Likewise, in this case, a parallel connection relationship is formed between $R_{23}$ and Rs. In this way, even if a short circuit occurs between the two terminals of the capacitor $C_{22}$, because a current passes through the resistor $R_{23}$ in the first branch, the current flowing out of the electrochemical cell 230 may pass through Rs. Therefore, a current passing through Rs is not 0, and a voltage definitely exists at the two ends of Rs, so that the first detection unit 221 can detect the voltage at the two ends of Rs (which is also a voltage at two ends of $R_{23}$ connected in parallel to Rs). Because a total current of a parallel circuit that includes $R_{23}$ and Rs is the current passing through the electrochemical cell 230, and the voltage that is at the two ends of Rs and that is detected by the first detection unit 221 and equivalent impedance of the circuit formed through a parallel connection between $R_{23}$ and Rs are known, the current passing through the electrochemical cell 230 can be obtained. Therefore, the charging loop can be controlled to be closed or opened, by detecting the voltage at the two ends of Rs. This does not affect overcurrent protection of the first detection unit 221 and the first switch unit 212, and does not cause burnout of the second filter capacitor 242.

Manner 4:

In this manner, the second fault isolation unit 260 includes two fault isolation elements, and each fault isolation element is electrically connected to one detection terminal of the second detection unit 222 and one terminal of the current detection element 211, so that the first detection unit 221 can work normally when, for example, the second filter capacitor 242 is short-circuited or a short circuit occurs between the two detection terminals used by the second detection unit 222.

Still referring to FIG. 9 and FIG. 10, in a possible implementation, the second fault isolation unit 260 includes a third fault isolation element 261 and a fourth fault isolation element 262. The third fault isolation element 261 includes a first terminal 1 and a second terminal 2. The fourth fault isolation element 262 includes a first terminal 1 and a second terminal 2. The first terminal 1 of the third fault isolation element 261 or the first terminal 1 of the fourth fault isolation element 262 is the first terminal 1 of the second fault isolation unit 260. In addition, the two detection terminals of the second detection unit 222 include a first detection terminal (for example, an IS1 terminal in FIG. 9 or FIG. 10) and a second detection terminal (for example, an IS2 terminal in FIG. 9 or FIG. 10), and the two terminals of the current detection element 211 include the first terminal 1 and the second terminal 2.

The first terminal 1 of the third fault isolation element 261 is electrically connected to the first detection terminal 1 of the second detection unit 222. The second terminal 2 of the third fault isolation element 261 is electrically connected to the first terminal 1 of the current detection element 211. The first terminal 1 of the fourth fault isolation element 262 is electrically connected to the second detection terminal 2 of the second detection unit 222. The second terminal 2 of the fourth fault isolation element 251 is connected to the second terminal 2 of the current detection element 211. Both of the first detection terminal 1 and the second detection terminal 2 of the second detection unit 222 are current detection terminals.

For example, the third fault isolation element 261 may be a resistor $R_{23}$, and the fourth fault isolation element may be a resistor $R_{24}$.

It should be noted that each of the third fault isolation element and the fourth fault isolation element may include one or more elements. This is not limited herein.

A working principle is the same as that in the manner 3. In this manner, for example, when a short circuit occurs between the terminals IS1 and IS2 of the second detection unit 222 or a short circuit occurs between the two terminals of the second filter capacitor $C_{22}$, referring to FIG. 13, there are two branches of a current direction in the charging loop. A first branch is as follows: the terminal P+→the electrochemical cell 230→$R_{24}$→$R_{23}$→the second switch unit 213→the first switch unit 212→the terminal P−. A second branch is as follows: the terminal P+→the electrochemical cell 230→Rs→the second switch unit 213→the first switch unit 212→the terminal P−. In this case, a parallel connection relationship is formed between Rs, and $R_{24}$ and $R_{23}$. A current flowing out of the electrochemical cell 230 may pass through Rs, so that the first detection unit 221 can detect a voltage at the two ends of Rs. Because a total current of a parallel circuit that includes $R_{24}$, $R_{23}$, and Rs is the current passing through the electrochemical cell 230, and the voltage that is at the two ends of Rs and that is detected by the first detection unit 221 and equivalent impedance of the circuit formed through a parallel connection between Rs, and $R_{24}$ and $R_{23}$ are known, the current passing through the electrochemical cell 230 can be obtained. Therefore, the charging loop can be controlled to be closed or opened, by detecting the voltage at the two ends of Rs. This does not affect overcurrent protection of the first detection unit 221 and the first switch unit 212, and does not cause burnout of the second detection unit 222 or the second filter capacitor 242.

Therefore, in the battery protection circuit provided in the embodiments of this application, the second fault isolation unit electrically connected to the second detection unit and the current detection element is disposed. In some cases, for example, when a short circuit occurs between the two detection terminals in the second detection unit that are configured to detect the voltage at the two ends of the current detection element, or when a short circuit occurs between the two terminals of the second filter capacitor connected in parallel between the two detection terminals, because the second fault isolation unit is disposed, currents can respectively pass through the second fault isolation unit and the current detection element, and a parallel connection relationship is formed between the second fault isolation unit and the current detection element, so that a voltage exists at the two ends of the current detection element. The loop can be controlled to be closed or opened, by detecting the voltage at the two ends of the current detection element. This does not affect overcurrent protection of the first detection unit and the first switch unit, and does not cause burnout of the second detection unit or the second filter capacitor.

A design is similar to that of the first fault isolation unit. To ensure overcurrent protection reliability as far as possible, resistance values of the second fault isolation unit 260 and the current detection element 221 may also be properly designed to make, as far as possible, an absolute value of a difference between the resistance value of the current detection element 221 and equivalent impedance of a circuit formed through a parallel connection between the second fault isolation unit 260 and the current detection element 221 be less than or equal to a preset value. Optionally, the preset value may be 50% of the resistance value of the current detection unit. Theoretically, the preset value should be as small as possible, because a smaller preset value can make a before-fault overcurrent protection effect be closer to an after-fault overcurrent protection effect, and indicates higher overcurrent protection reliability.

Optionally, the resistance value of the current detection element 211 is a milliohm-level resistance, and a resistance value of the second fault isolation unit 260 is an ohm-level resistance.

For specific principle descriptions, refer to the foregoing related descriptions of the design of the resistance values of the first fault isolation unit and the current detection element. For brevity, details are not described again.

An embodiment of this application further provides a battery protection board. The battery protection board includes the battery protection circuit in any possible implementation of the foregoing embodiments. For example, the battery protection board may be the battery protection board 113-1 shown in FIG. 1.

An embodiment of this application further provides a battery. The battery includes an electrochemical cell and a battery protection board. The battery protection board includes the battery protection circuit in any possible implementation of the foregoing embodiments. For example, the battery may be the battery 113 shown in FIG. 1.

It may be clearly understood by a person skilled in the art that, for ease and brevity of description, for detailed working processes of the foregoing system, apparatus, and unit, reference may be made to corresponding processes in the foregoing method embodiments, and details are not described herein again.

In the several embodiments provided in this application, it should be understood that the disclosed system, apparatus, and method may be implemented in other manners. For example, the described apparatus embodiment is merely an example. For example, the division into units is merely logical function division, and may be other division in actual implementation. For example, a plurality of units or components may be combined, or may be integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, and may be located in one position, or may be distributed on a plurality of network units. Some or all of the units may be selected based on an actual requirement to achieve the objectives of the solutions in the embodiments.

In addition, functional units in the embodiments of this application may be integrated into one processing unit, or each unit may exist alone physically, or two or more units may be integrated into one unit.

When the functions are implemented in a form of a software function unit and sold or used as an independent product, the functions may be stored in a computer-readable storage medium. Based on such an understanding, the technical solutions of this application essentially, or the part contributing to the prior art, or some of the technical solutions may be implemented in a form of a software product. The computer software product is stored in a storage medium, and includes several instructions for instructing a computer device (which may be a personal computer, a server, a network device, or the like) to perform all or some of the steps of the methods described in the embodiments of this application. The foregoing storage medium includes any medium that can store program code, such as a USB flash drive, a removable hard disk, a read-only memory (read-only memory, ROM), a random access memory (random access memory, RAM), a magnetic disk, or an optical disc.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A battery protection circuit, wherein the battery protection circuit comprises a connector, a power supply, a load, and a battery, the connector is electrically connected to the power supply, the power supply is electrically connected to the battery, and the battery is electrically connected to the load, wherein the battery comprises an electrochemical cell and a battery protection board, a battery protection circuit in the battery protection board comprises two input terminals, and each of the two input terminals is electrically connected to the electrochemical cell, wherein the battery protection board comprises the battery protection circuit, wherein the battery protection circuit comprises:
- a first output terminal and a second output terminal, configured to electrically connect to a power source or a load;
- a current detection element, a first switch unit, and a second switch unit, configured to connect to the electrochemical cell in series between the first output terminal and the second output terminal, so that the current detection element, the first switch unit, the second switch unit, the electrochemical cell, and the load or the power supply form a loop, to charge or discharge the electrochemical cell, wherein the current detection element comprises two terminals;
- a first detection unit, comprising a power supply terminal, a control terminal, and two detection terminals, wherein the power supply terminal of the first detection unit is electrically connected to the first output terminal, the two detection terminals of the first detection unit are electrically connected to the two terminals of the current detection element respectively, and the control terminal of the first detection unit is electrically connected to a terminal of the first switch unit; and
- a second detection unit, comprising a power supply terminal, a control terminal, and two detection terminals, wherein the power supply terminal of the second detection unit is electrically connected to the first output terminal, the two detection terminals of the second detection unit are electrically connected to the two terminals of the current detection element respectively, and the control terminal of the second detection unit is electrically connected to a terminal of the second switch unit.

2. The battery protection circuit according to claim 1, wherein the battery protection circuit further comprises:
- a first fault isolation unit, electrically connected to the first detection unit and the current detection element separately, so that two ends of the current detection element are not short-circuited when a circuit electrically connected to a first terminal of the first fault isolation unit is short-circuited, wherein the first terminal of the first fault isolation unit is electrically connected to one of the two detection terminals of the first detection unit.

3. The battery protection circuit according to claim 2, wherein the first fault isolation unit comprises:
- a first fault isolation element, wherein the first fault isolation element comprises a first terminal and a second terminal, the first terminal of the first fault isolation element is the first terminal of the first fault isolation unit, the two detection terminals of the first detection unit comprise a first detection terminal and a second detection terminal, and the two terminals of the current detection element comprise a first terminal and a second terminal, wherein
the first terminal of the first fault isolation element is electrically connected to the first detection terminal of the first detection unit, the second terminal of the first fault isolation element is electrically connected to the first terminal of the current detection element, and the second terminal of the current detection element is electrically connected to the second detection terminal of the first detection unit.

4. The battery protection circuit according to claim 3, wherein the first fault isolation element is a resistor.

5. The battery protection circuit according to claim 2, wherein the first fault isolation unit comprises a first fault isolation element and a second fault isolation element, the first fault isolation element comprises a first terminal and a second terminal, the second fault isolation element comprises a first terminal and a second terminal, the first terminal of the first fault isolation element or the first terminal of the second fault isolation element is the first terminal of the first fault isolation unit, the two detection terminals of the first detection unit comprise a first detection terminal and a second detection terminal, and the two terminals of the current detection element comprise a first terminal and a second terminal; and
the first terminal of the first fault isolation element is electrically connected to the first detection terminal of the first detection unit, the second terminal of the first fault isolation element is electrically connected to the first terminal of the current detection element, the first terminal of the second fault isolation element is electrically connected to the second detection terminal of the first detection unit, and the second terminal of the second fault isolation element is electrically connected to the second terminal of the current detection element.

6. The battery protection circuit according to claim 2, wherein an absolute value of a difference between a resistance value of the current detection element and equivalent impedance of a circuit formed through a parallel connection between the first fault isolation unit and the current detection element is less than or equal to a preset value.

7. The battery protection circuit according to claim 1, wherein the battery protection circuit further comprises:
- a second fault isolation unit, electrically connected to the second detection unit and the current detection element separately, so that two ends of the current detection element are not short-circuited when a circuit electrically connected to a first terminal of the second fault isolation unit is short-circuited, wherein the first terminal of the second fault isolation unit is electrically connected to one of the two detection terminals of the second detection unit.

8. The battery protection circuit according to claim 7, wherein the second fault isolation unit comprises:
- a third fault isolation element, wherein the third fault isolation element comprises a first terminal and a second terminal, the first terminal of the third fault isolation element is the first terminal of the second fault isolation unit, the two detection terminals of the second detection unit comprise a first detection terminal and a second detection terminal, and the two terminals of the current detection element comprise the first terminal and the second terminal; and
the first terminal of the third fault isolation element is electrically connected to the first detection terminal of the second detection unit, the second terminal of the third fault isolation element is electrically connected to the first terminal of the current detection element, and the second terminal of the current detection element is electrically connected to the second detection terminal of the second detection unit.

9. The battery protection circuit according to claim 7, wherein the second fault isolation unit comprises:
- a third fault isolation element and a fourth fault isolation element, wherein the third fault isolation element comprises a first terminal and a second terminal, the fourth fault isolation element comprises a first terminal and a second terminal, the first terminal of the third fault isolation element or the first terminal of the fourth fault isolation element is the first terminal of the second fault isolation unit, the two detection terminals of the second detection unit comprise a first detection terminal and a second detection terminal, and the two terminals of the current detection element comprise the first terminal and the second terminal; and the first terminal of the third fault isolation element is electrically connected to the first detection terminal of the second detection unit, the second terminal of the third fault isolation element is electrically connected to the first terminal of the current detection element, the first terminal of the fourth fault isolation element is electrically connected to the second detection terminal of the second detection unit, and the second terminal of the fourth fault isolation element is electrically connected to the second terminal of the current detection element.

10. The battery protection circuit according to claim 1, wherein the battery protection circuit further comprises:
a first filter capacitor, connected in parallel between the two detection terminals of the first detection unit.

11. The battery protection circuit according to claim 1, wherein the battery protection circuit further comprises:
a second filter capacitor, connected in parallel between the two detection terminals of the second detection unit.

12. The battery protection circuit according to claim 1, wherein
the control terminal of the first detection unit comprises a discharging control terminal and a charging control terminal, the first switch unit comprises a first discharging switch element and a first charging switch element, the first discharging switch element comprises a first terminal, the first terminal of the first discharging switch element is electrically connected to the discharging control terminal of the first detection unit, the first charging switch element comprises a first terminal, and the first terminal of the first charging switch element is electrically connected to the charging control terminal of the first detection unit; and/or the control terminal of the second detection unit comprises a discharging control terminal and a charging control terminal, the second switch unit comprises a second discharging switch element and a second charging switch element, the second discharging switch element comprises a first terminal, the first terminal of the second discharging switch element is electrically connected to the discharging control terminal of the second detection unit, the second charging switch element comprises a first terminal, and the first terminal of the second charging switch element is electrically connected to the charging control terminal of the second detection unit.

13. A terminal device, wherein the terminal device comprises a connector, a power supply, a load, and a battery, the connector is electrically connected to the power supply, the battery comprises a battery protection circuit board and an electrochemical cell, and the battery protection circuit board comprises:
two output terminals, electrically connected to the load or the power supply;
a current detection element, a first switch unit, and a second switch unit, connected to the electrochemical cell in series between the two output terminals, so that the current detection element, the first switch unit, the second switch unit, the electrochemical cell, and the load or the power supply form a loop, to charge or discharge the electrochemical cell, wherein the first switch unit and the second switch unit are both configured to control the loop to be closed or opened;

a first detection unit, configured to detect a voltage between two ends of the battery detection element, and if the voltage between the two ends of the current detection element is greater than a preset overcurrent detection voltage threshold of the first detection unit, output a control signal to the first switch unit to open the first switch unit; and a second detection unit, configured to detect the voltage between the two ends of the battery detection element, and if the voltage between the two ends of the current detection element is greater than a preset overcurrent detection voltage threshold of the second detection unit, output a control signal to the second switch unit to open the second switch unit, wherein the preset overcurrent detection voltage threshold of the first detection unit is different from the preset overcurrent detection voltage threshold of the second detection unit.

14. The terminal device according to claim 13, wherein the first detection unit comprises two detection terminals configured to detect the voltage between the two ends of the current detection unit, and the battery protection board further comprises:
a first fault isolation unit, electrically connected to the first detection unit and the current detection element separately, and configured to shunt, with the current detection element when a circuit electrically connected to a first terminal of the first fault isolation unit is short-circuited, a current passing through the electrochemical cell, so that the two ends of the current detection element are not short-circuited, wherein the first terminal of the first fault isolation unit is electrically connected to one detection terminal of the first detection unit.

15. The terminal device according to claim 13, wherein the second detection unit comprises two detection terminals configured to detect the voltage between the two ends of the battery detection unit, and the battery protection board further comprises:
a second fault isolation unit, electrically connected to the second detection unit and the current detection element separately, and configured to shunt, with the current detection element when a circuit electrically connected to a first terminal of the second fault isolation unit is short-circuited, a current passing through the electrochemical cell, so that the two ends of the current detection element are not short-circuited, wherein the first terminal of the second fault isolation unit is electrically connected to one detection terminal of the second detection unit.

16. The terminal device according to claim 14, wherein the second detection unit comprises two detection terminals configured to detect the voltage between the two ends of the battery detection unit, and the battery protection board further comprises:
a second fault isolation unit, electrically connected to the second detection unit and the current detection element separately, and configured to shunt, with the current detection element when a circuit electrically connected to a first terminal of the second fault isolation unit is short-circuited, a current passing through the electrochemical cell, so that the two ends of the current detection element are not short-circuited, wherein the first terminal of the second fault isolation unit is electrically connected to one detection terminal of the second detection unit.

\* \* \* \* \*